(12) United States Patent
Arimoto et al.

(10) Patent No.: US 6,400,625 B2
(45) Date of Patent: Jun. 4, 2002

(54) SEMICONDUCTOR INTEGRATED CIRCUIT DEVICE CAPABLE OF PERFORMING OPERATIONAL TEST FOR CONTAINED MEMORY CORE AT OPERATING FREQUENCY HIGHER THAN THAT OF MEMORY TESTER

(75) Inventors: Kazutami Arimoto; Hiroki Shimano; Katsumi Dosaka, all of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/810,503

(22) Filed: Mar. 19, 2001

(30) Foreign Application Priority Data

May 10, 2000 (JP) ........................................ 2000-136822

(51) Int. Cl.[7] ................................................ G11C 7/00
(52) U.S. Cl. ............. 365/201; 365/189.02; 365/189.05; 365/230.08
(58) Field of Search ........................... 365/201, 189.02, 365/230.02, 189.05, 230.08

(56) References Cited

U.S. PATENT DOCUMENTS

| 5,381,421 A | * | 1/1995 | Dickol et al. ................. 371/27 |
| 5,524,114 A | * | 6/1996 | Peng ........................... 371/22.1 |
| 5,933,379 A | * | 8/1999 | Park et al. ................... 365/201 |
| 5,991,888 A | * | 11/1999 | Faulkner et al. ............ 713/501 |

FOREIGN PATENT DOCUMENTS

| JP | 06-187797 | 8/1994 |
| JP | 11-030646 | 2/1999 |

* cited by examiner

*Primary Examiner*—Son T. Dinh
(74) *Attorney, Agent, or Firm*—McDermott, Will & Emery

(57) ABSTRACT

A test interface circuit carries out an operational test based on a signal input to test pin terminals by directly accessing a DRAM core. A frequency multiplication circuit generates an internal test clock signal by multiplying the frequency of an external test clock signal input to the test pin terminal. A data shifter shifts read data from the DRAM core which operates according to the internal test clock signal in a test mode by N clock cycles (N is an integer of at least 0 determined by column latency) of the internal test clock signal to output the read data from the test pin terminals in synchronization with the external clock test signal.

13 Claims, 18 Drawing Sheets

SEMICONDUCTOR INTEGRATED CIRCUIT DEVICE CAPABLE OF PERFORMING OPERATIONAL TEST FOR CONTAINED MEMORY CORE AT OPERATING FREQUENCY HIGHER THAN THAT OF MEMORY TESTER

BACKGROUND OF THE INVENTION

1. Field of the Invention

The present invention relates to semiconductor integrated circuit devices and particularly to a system LSI equipped with a memory. More particularly, the present invention relates to a configuration of a test interface circuit for externally and directly testing a memory in the system LSI.

2. Description of the Background Art

A system LSI such as a logic merged DRAM has been developed in which a logic such as a processor and an ASIC (Application Specific Integrated Circuit) and a dynamic random access memory (DRAM) of mass storage capacity are integrated on one semiconductor chip (semiconductor substrate). In such a system LSI, interconnection of a logic and a memory such as a DRAM by a multi-bit internal data bus of 128 to 512 bits can attain a data transfer rate higher than that of a general purpose DRAM by at least one or two orders of magnitude.

Since the DRAM and the logic are connected by an internal interconnection, the length of the internal interconnection is sufficiently shorter and has smaller parasitic impedance than an on-board interconnection. That results in achievement of substantial reduction in the charging/discharging current of a data bus as well as signal transmission at high speed. In addition, the number of external pin terminals in the logic can be reduced as compared with a type in which a general purpose DRAM is externally provided for the logic.

From these reasons, the system LSI such as a logic merged DRAM greatly contributes to attaining higher performance of information devices which carry out processing dealing with mass data such as three dimensional graphics processing and image/audio processing.

In the above described system LSI such as a logic merged DRAM, only the logic is coupled to the external pin terminals via a pad. Therefore, when the function of a memory such as a contained DRAM is to be tested, the test needs to be performed through the logic. In this case, however, the logic performs a control operation for testing, which increases the load of the logic. In addition, it becomes necessary to externally supply the logic with an instruction to perform a functional test for a memory such as a DRAM, to give from the logic to the memory a control signal for performing the functional test, and to read out the test result through the logic.

Therefore, the memory functional test in the system LSI such as a logic mixed DRAM is carried out through the logic, and the operating timing margin for the memory and the like cannot be tested correctly.

In view of program capacity as well, the number of test patterns provided by the logic is limited, and sufficient testing cannot be performed. Because of the factors, it is difficult to sufficiently ensure the reliability of a memory such as a DRAM. Since the probability of defect generation in the logic itself becomes higher with increase in the gate scale, the reliability of memory testing is lowered. Therefore, it becomes necessary to directly test a memory such as a DRAM from outside by using a dedicated tester including a memory tester. Hereinafter, the system LSI with contained DRAM is referred to as a DRAM contained system LSI.

FIG. 26 schematically shows a configuration of a conventional DRAM contained system LSI 900.

Referring to FIG. 26, system LSI 900 includes a large scale logic LG coupled to external pin terminals LPGA and performing directed processing, an analog core ACR coupled between large scale logic LG and external pin terminals APG and performing processing for an analog signal, a DRAM core MCR coupled to large scale logic LG through an internal interconnection and storing data required by large scale logic LG, and a test interface circuit TIC disconnecting large scale logic LG and DRAM core MCR in a test mode and coupling an external memory tester to DRAM core MCR through test pin terminals TPG. DRAM core MCR receives a power supply voltage VCC through a power supply terminal PST.

Analog core ACR includes a phase locked loop circuit (PLL) generating an internal clock signal, an analog/digital converter converting an external analog signal to a digital signal, and a digital/analog converter converting a digital signal applied from large scale logic LG to an analog signal and outputting the analog signal.

DRAM core MCR which is a synchronous DRAM (SDRAM) captures data and an operation mode designation signal and outputs data in synchronization with an applied clock signal.

Large scale logic LG includes a memory control unit for carrying out processing such as image/audio information processing and controlling access to DRAM core MCR.

As shown in FIG. 26, provision of test interface circuit TIC makes it possible to completely disconnect DRAM core MCR from the logic portion (large scale logic LG) so as to directly access DRAM core MCR through test pin terminals TPG and to directly and externally control and observe DRAM core MCR. Such a test procedure is called direct memory access testing. By providing test interface circuit TIC, an operational test of a similar level to that for a general purpose DRAM (SDRAM) using a conventional memory tester can be performed.

FIG. 27 shows a configuration of test interface circuit TIC shown in FIG. 26 and associated portions.

Referring to FIG. 27, test pin terminals TPG include a pin terminal receiving a test clock signal TCLK1, a pin terminal receiving a test control signal TCMD for designating a test operation mode, a pin terminal receiving a test address TAD for designating a memory cell in DRAM core MCR which is to be accessed in a test mode, a pin terminal receiving write data TDin in the test mode, and a pin terminal receiving output data TDout from test interface circuit TIC in the test mode.

Test write data TDin applied to test interface circuit TIC and test output data TDout from test interface circuit TIC are set to the bit width of 8 bits, for example, similarly to a general purpose DRAM.

Test interface circuit TIC includes a latch/command decoder 1 capturing, in synchronization with test clock signal TCLK1, test control signal TCMD, test address TAD and test write data TDin applied to test pin terminals TPG, and performing processing such as decoding the test control signal to an internal command (operation mode designation signal) to be issued to DRAM core MCR and expanding test input data TDin of a 8-bit width to write data of 256 bits, a mode register 2 storing information such as the column latency of DRAM core MCR, a CA shifter 3 shifting, according to the column latency information stored in mode register 2, a read selection designation signal applied from latch/command decoder 1 to produce a read data selection signal RD_S, and a 256:8 selection circuit 4 selecting, according to read data selection signal RD_S from CA shifter 3, 8-bit data from the 256-bit read data read out from DRAM core MCR. Hereinafter, the 256:8 selection circuit is also referred to as a read data selection circuit.

As test peripheral circuits, a selector 5 selectively coupling DRAM core MCR and one of the large scale logic LG and test interface circuit TIC in response to test mode designation signal TE, a gate circuit 6 receiving clock signal CLK applied from the large scale logic LG, for example, in a normal operation mode and test clock signal TCLK1 applied in the test mode and supplying a clock signal DCLK to DRAM core MCR, and a gate circuit 7 transmitting to test interface circuit TIC 256-bit read data RD read out from DRAM core MCR at the time of activation of test mode designation signal TE are provided. 256-bit read data RD read out from DRAM core MCR is applied to the large scale logic LG without passing through selector 5. This is intended to apply read data at high speed to the large scale logic in the normal operation.

DRAM core MCR captures applied data and signals and outputs read data RD in synchronization with DRAM operational clock signal DCLK.

FIG. 28 shows in more detail the configuration of latch/command decoder 1 shown in FIG. 27.

Referring to FIG. 28, latch/command decoder 1 includes a latch circuit 1a responsive to a rise of test clock signal TCLK1 for capturing and latching test control signal TCMD, test address TAD and test write data TDin input to test pin terminals TPG, a command decoder 1b receiving and decoding test control signal TCMD and prescribed bits of test address TAD from latch circuit 1a and producing a command to designate an operation mode, a bit width expansion circuit 1c expanding 8-bit test write data TDin from latch circuit 1a to 256-bit test write data, and a latch circuit 1d responsive to a fall of test clock signal TCLK1 for capturing and latching output signals of command decoder 1b and bit width expansion circuit 1c.

A test command TIFCMD, a test address TIFAD and test write data TIFDin are output from latch circuit 1d and applied to DRAM core MCR through selector 5. The command from command decoder 1b is also applied to mode register 2 and, when a mode register set mode is designated, directs mode register 2 to store address bits or test data.

As described above, latch circuit 1a assumes a latch state (or through state) in response to a rise of test clock signal TCLK1. Latch circuit 1d assumes a latch state (or through state) complementarily to latch circuit 1a in response to a fall of test clock signal TCLK1.

Command decoder 1b receives test control signal TCMD and prescribed address bits and generates internal commands for designating an operational mode, such as a mode register set command MRS, a no operation command NOP, a bank active command ACT, a bank precharge command PRE, a write command WRITE, a read command READ and an auto refresh command REFA.

FIG. 29 is a timing chart illustrating an operation of the test interface circuit shown in FIG. 27.

As shown in FIG. 27, DRAM core MCR transfers write data INDin and read data RD on different buses. For test pin terminals TPG as well, test input data TDin and test output data TDout during testing are transferred by using different pin terminals. Here, test directions for the DRAM core are received from an external memory tester.

First, a data reading operation from the DRAM core in the test mode will be described.

Referring to FIG. 29, in clock cycle #1, test mode control signal TCMD for generating read command (read operation designation signal) READ is input to direct DRAM core MCR to read data. In clock cycle #2, test control signal TCMD applied in clock cycle #1 is supplied, as internal control signal INCMD for designating read command READ, from test interface circuit TIC to DRAM core MCR through selector 5.

In the test mode, according to a test mode designation signal TE, selector 5 disconnects the large scale logic and DRAM core MCR, and selects a test interface command (test operation mode designation signal) TIFCMD, a test interface address TIFAD, test interface input data TIFDin output from test interface circuit TIC and transfers them to DRAM core MCR.

Gate circuit 7 transmits data RD read out from DRAM core MCR to test interface circuit TIC according to test mode designation signal TE. DRAM core MCR reads out internal data in synchronization with operation clock signal DCLK applied from gate circuit 6 and according to an internal address INADD applied at the same time. When column latency CL of DRAM core MCR is two clock cycles (hereinafter, such a case is also referred to as "the case of CL=2"), valid read data is output at a rising edge of test clock signal TCLK1 in clock cycle #4 according to internal read command READ (INCMD) applied in clock cycle #2.

In test interface circuit TIC, CA shifter 3 shifts, according to test clock signal TCLK1, read data selection signal RD_S, which is made of the upper 5 bits of a column address included in test address TAD, for a clock cycle of column latency CL. When read data selection signal RD_S is generated from test address TAD, the delay time in test interface circuit TIC is included in addition to the shift period.

Therefore, at timing when 256-bit read data RD from DRAM core MCR reaches read data selection circuit 4 through gate circuit 7, that is, in clock cycle #4, read data selection signal RD_S from CA shifter 3 is also validated. Therefore, read data selection circuit 4 selects 8-bit data from 256-bit data according to read data selection signal RD_S (<0>) and transmits the data as test output data TDout (D00) to a pin terminal group.

Then, a data writing operation for the DRAM core in the test mode will be described.

In clock cycle #2, test control signal TCMD indicating data writing is applied from an external memory tester to DRAM core MCR. Test control signal TCMD is decoded to write command (operation mode designation signal) WRITE indicating data writing by latch/command decoder 1. When the write command is applied, test write data TDin (DA) is also simultaneously applied to test pin terminals. Write command WRITE and test write data DA are also transferred in synchronization with test clock signal TCLK1 in test interface circuit TIC.

In latch/command decoder 1, for input data TDin, bit width expansion circuit 1c converts 8-bit test input data DA (TDin) to 256-bit internal write data DAin. In other words, an 8-bit data line is expanded to a 256-bit data line.

Furthermore, the external memory tester applies as test control signal TCMD a test control signal which is decoded to read command READ directing data reading in clock cycle #3, and a test control signal which is decoded to write command WRITE indicating data writing in the next clock cycle #4.

In this case, in clock cycle #5, internal write data DBin is applied to DRAM core MCR. Then, in clock cycle #6, 256-bit data Dout is read out from DRAM core MCR, and 8-bit read data D01 selected by read data selection circuit 4 according to read data selection signal RD_S (<1>) is output as test data TDout from test pin terminals TPG.

Mode register 2 stores data indicating the number of cycles of column latency CL and signal propagation delay (one clock cycle in the example shown in FIG. 27) in test interface circuit TIC. CA shifter 3 carries out its shifting operation according to test clock signal TCLK1 for a period corresponding to the data stored in mode register 2, and thus data RD read out from DRAM core MCR can be selected at correct timing to output test data TDout.

By providing test interface circuit TIC as described above, it becomes possible to directly access DRAM core MCR from an external memory tester and to carry out direct memory access testing. Therefore, a necessary test for DRAM core MCR can be performed by using a memory tester for a general purpose SDRAM.

However, it is necessary to perform an operational test at an actual operating frequency of a DRAM core (hereinafter, such testing is also referred to as an AT-SPEED test) to ensure the operation of the DRAM core. Therefore, in view of higher frequency operation of a recent system LSI, an expensive high speed memory tester capable of supplying a high frequency test clock is necessary. That leads to a problem that the test cost of the DRAM core is increased.

SUMMARY OF THE INVENTION

An object of the present invention is to provide a configuration of a test interface circuit capable of performing an operational test for a memory core at an actual operating frequency even by using an inexpensive low speed memory tester in a semiconductor integrated circuit device equipped with the memory core.

In summary, the present invention is a semiconductor integrated circuit device including a memory circuit and a test interface circuit. The memory circuit operates in synchronization with an operational clock signal, and performs given operational directions. During testing, the test interface circuit supplies the operational clock signal and the operational directions to the memory circuit and communicates data with the memory circuit according to test directions input in synchronization with a test clock signal. The test interface circuit includes a frequency multiplication circuit multiplying the frequency of the test clock signal to generate an internal test clock signal to be supplied as the operational clock signal to the memory circuit.

According to another aspect of the present invention, a semiconductor integrated circuit device includes a memory circuit and a test interface circuit. The memory circuit operates in synchronization with an operational clock signal and performs given operational directions. During testing, the test interface circuit supplies the operational clock signal and the operation directions to the memory circuit and communicates data with the memory circuit according to test directions input in synchronization with a test clock signal. The test interface circuit includes a test clock control terminal receiving a selection signal for selecting a frequency of the operational clock signal during testing, and a frequency multiplication circuit generating, according to the test clock signal, an internal test clock signal to be supplied as the operational clock signal to the memory circuit, the frequency multiplication circuit outputting, according to the selection signal, one of the test clock signal and a clock signal generated by multiplying the frequency of the test clock signal as the internal test clock signal.

Therefore, a major advantage of the present invention is that, during testing, the test interface circuit capable of directly accessing the memory circuit according to the external test directions allows the memory circuit to be operated in synchronization with the internal test clock signal generated by multiplying the frequency of the test clock signal. It is therefore possible to carry out direct memory access testing at a high frequently for the memory circuit even by using a low speed memory tester.

Since executing/stopping of the frequency multiplication operation during internal test clock signal generation can be selected by inputting of the selection signal to the test clock control terminal, whether or not the frequency of the external test clock signal is multiplied can be selected in direct memory access testing for the memory circuit.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, the embodiments of the present invention will be described in detail with reference to the drawings.

First Embodiment

Figure 1:
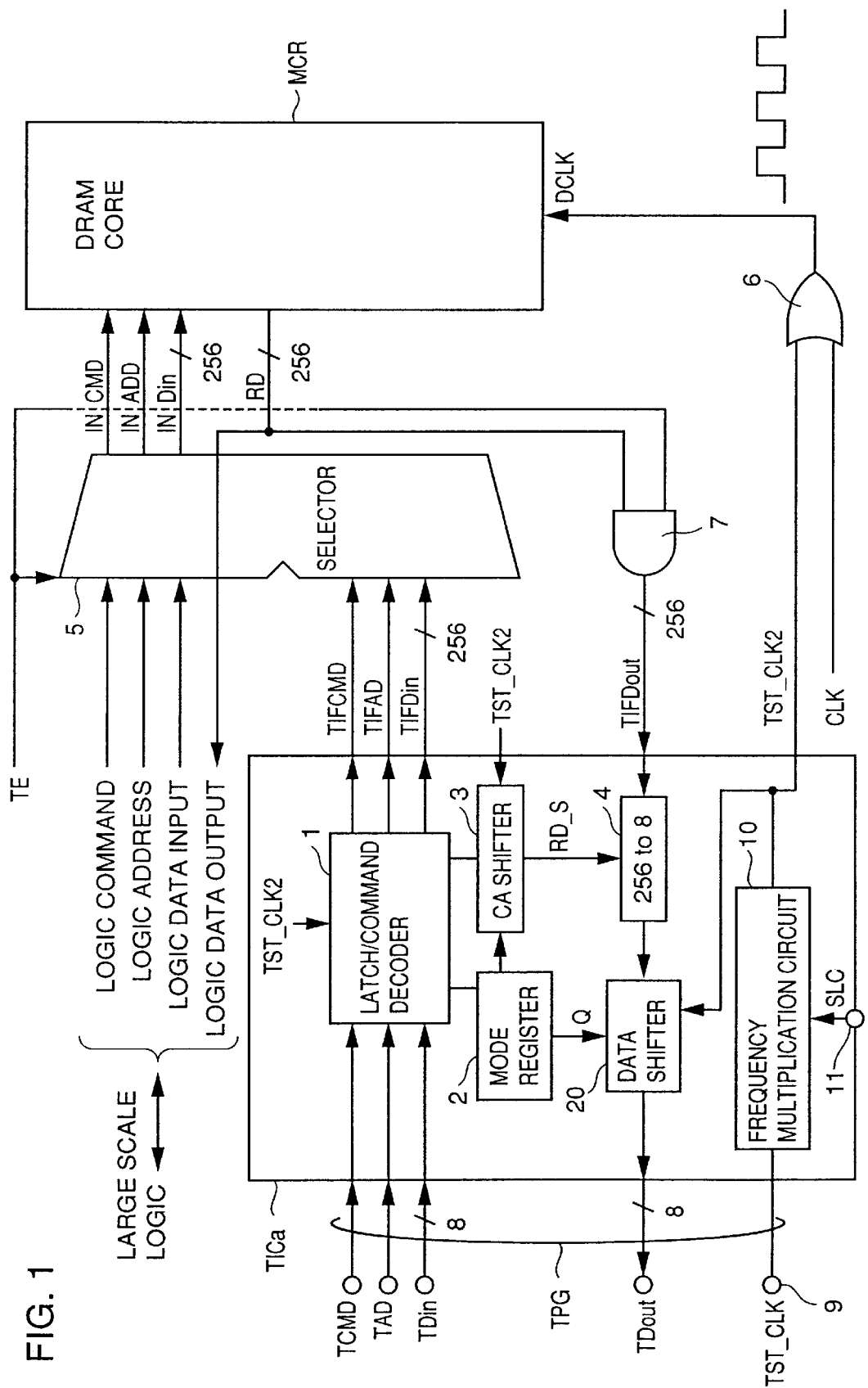
FIG. 1 schematically shows a configuration of a main part of a semiconductor integrated circuit device according to a first embodiment of the present invention.
Figure 27:
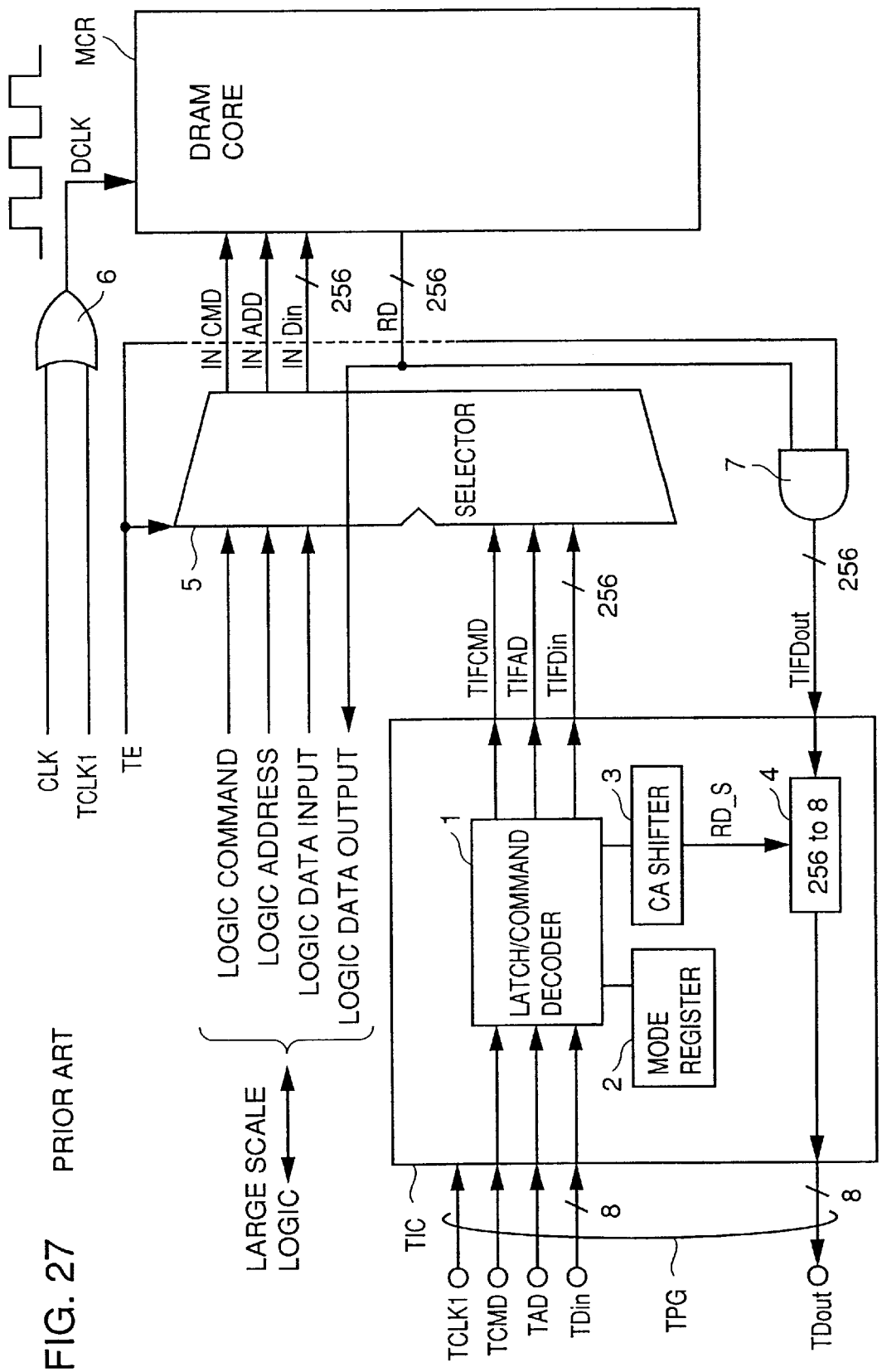
FIG. 27 shows a configuration of test interface circuit TIC shown in FIG. 26 and associated portions.

Referring to FIG. 1, a test interface circuit TICa according to a first embodiment of the present invention includes, in addition to the configuration of conventional test interface circuit TIC shown in FIG. 27, a frequency multiplication circuit 10 multiplying the frequency of an external test clock signal TST_CLK, which is input from an external memory tester, for example, to a test pin terminal TPG, to an internal test clock signal TST_CLK2 having a frequency twice as high as external test clock signal TST_CLK, a data shifter 20 shifting test output data transmitted from a read data selection circuit 4 for a period corresponding to a timing control signal Q generated by a mode register 2 and outputting the data as output data TDout to test pin terminals TPG, and a test clock control terminal 11 receiving a selection signal SLC for selecting executing/stopping of the frequency multiplication operation of the test clock signal in frequency multiplication circuit 10.

Since a DRAM core MCR, a selector 5 and gate circuits 6 and 7 are similar to those in the conventional configuration shown in FIG. 27, description thereof will not be repeated.

Figure 2:
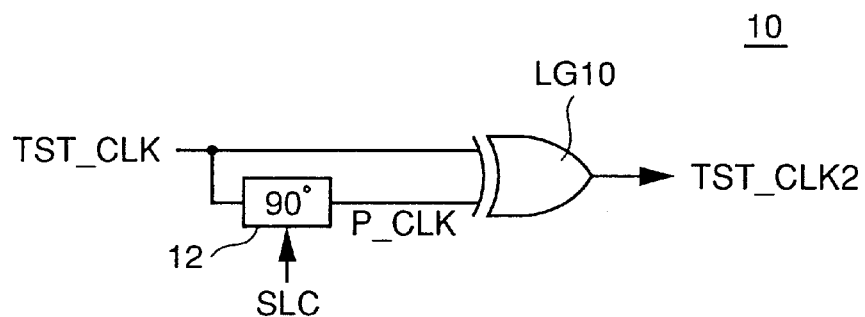
FIG. 2 shows one example of a configuration of a frequency multiplication circuit 10.

Referring to FIG. 2, frequency multiplication circuit 10 has a delay circuit 12 receiving external test clock signal TST_CLK and outputting a clock signal P_CLK, and a logic gate LG10 outputting the result of an exclusive OR operation of external test clock signal TST_CLK and clock signal P_CLK. When the frequency multiplication operation is designated by selection signal SLC, delay circuit 12 outputs as clock signal P_CLK a signal generated by delaying the phase of external test clock signal TST_CLK by 90° (¼ cycle).

Figure 3:
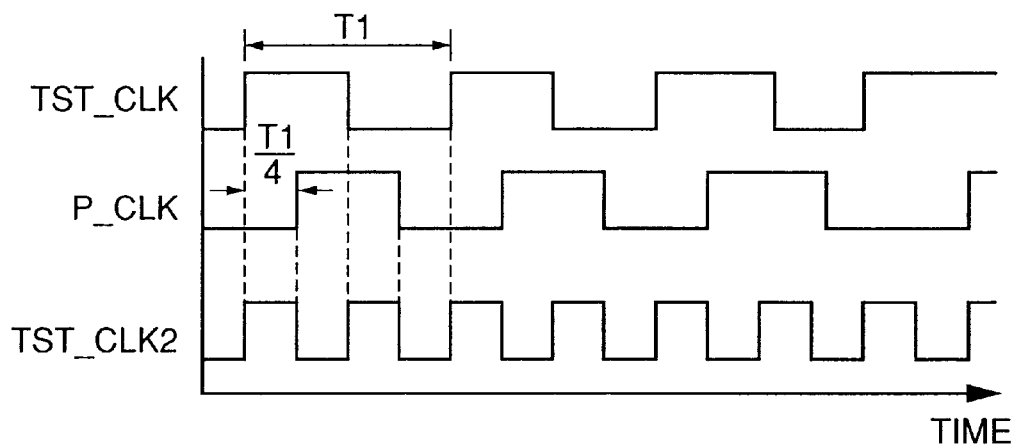
FIG. 3 is a timing chart illustrating an operation of frequency multiplication circuit 10 in a frequency multiplication operation.

Referring to FIG. 3, if the cycle of external test clock signal TST_CLK is T1, delay circuit 12 delays external test clock signal TST_CLK by a time period corresponding to a phase difference of 90°, that is, T¼ to generate clock signal P_CLK. Logic gate LG10 outputs as internal test clock signal TST_CLK2 an exclusive OR operation result between external test clock signal TST_CLK and clock signal P_CLK. Therefore, internal test clock signal TST_CLK2 has a frequency twice as high as external test clock signal TST_CLK.

On the other hand, when selection signal SLC designates stopping of the frequency multiplication operation, delay circuit 12 fixes the signal level of clock signal P_CLK at a logic low level. Thus, internal test clock signal TST_CLK2 output from logic gate LG10 has the same frequency as external test clock signal TST_CLK. As described above, selection signal SLC input to test control terminal 11 can select executing/stopping of the frequency multiplication operation in frequency multiplication circuit 10.

Figure 4:
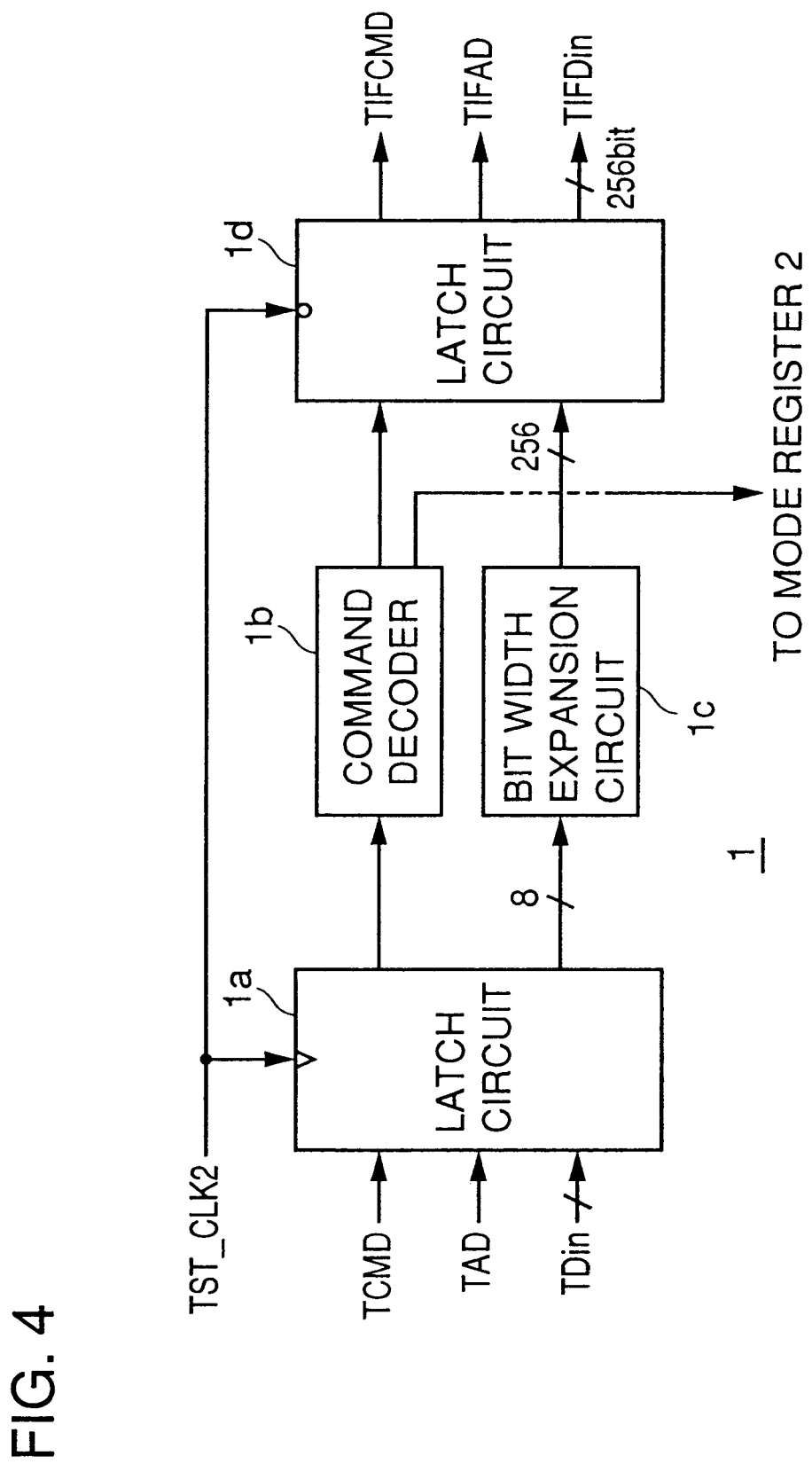
FIG. 4 schematically shows a configuration of a latch/command decoder 1 shown in FIG. 1.
Figure 28:
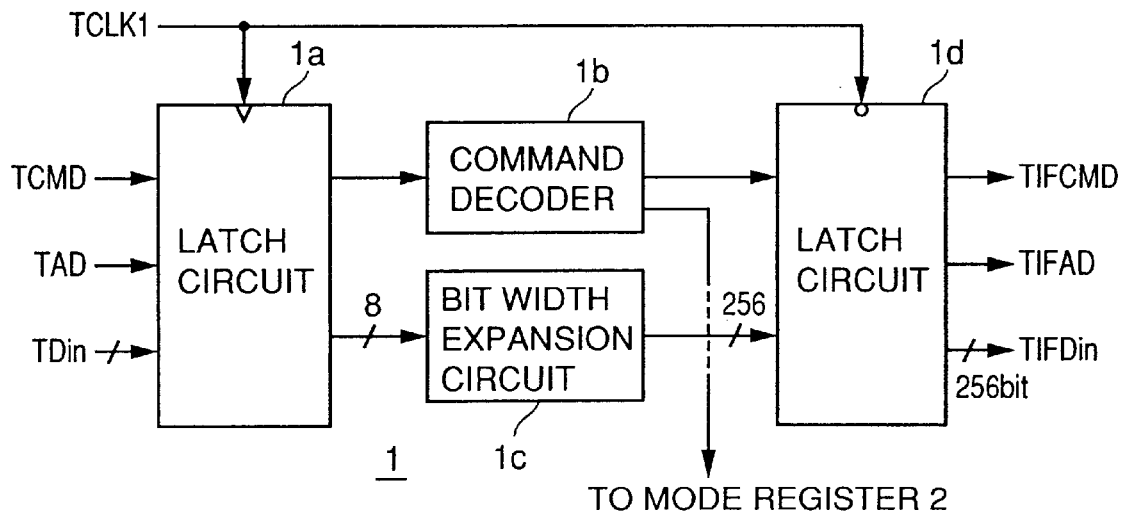
FIG. 28 shows in more detail the configuration of latch/command decoder 1.
Figure 29:
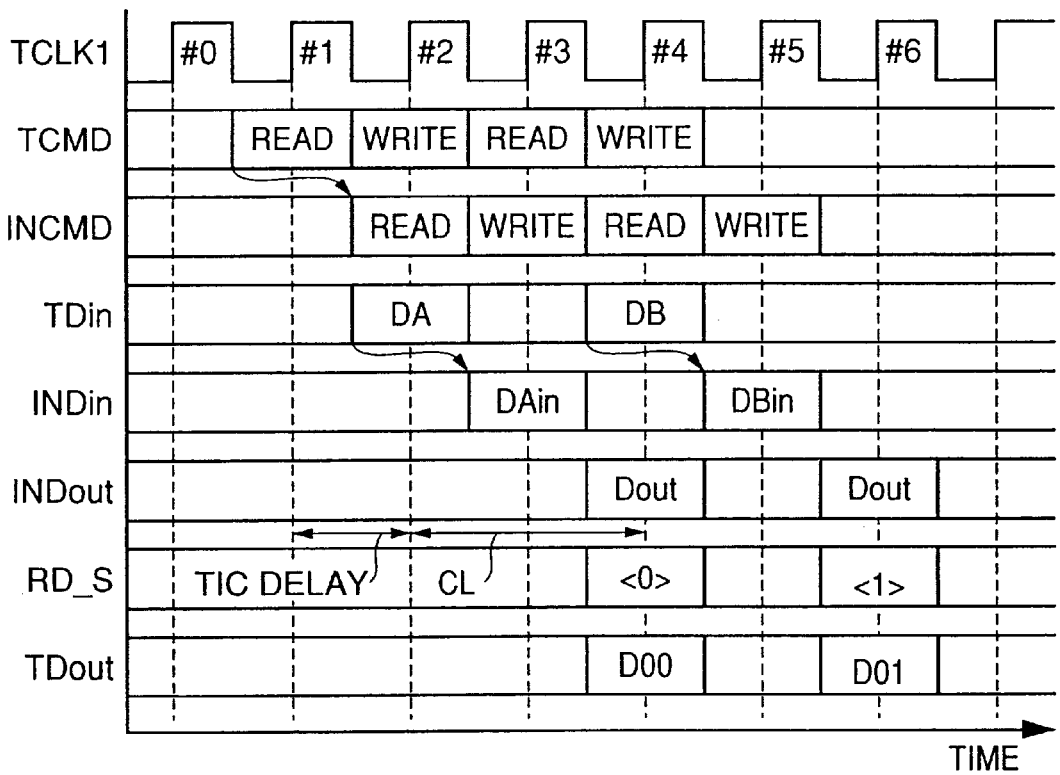
FIG. 29 is a timing chart illustrating an operation of the test interface circuit shown in FIG. 27.

Referring to FIG. 4, in latch/command decoder 1 in the test interface circuit according to the first embodiment, a latch circuit 1a at an input stage and a latch circuit 1d at an output stage both operate in synchronization not with external test clock signal TST_CLK but with internal test clock signal TST_CLK2. Other parts are the same as in the configuration shown in FIG. 28 and corresponding portions are denoted by the same reference characters.

Latch circuit 1a which is an up-edge trigger latch circuit, for example, latches signals input to test pin terminals TPG in response to a rising edge of internal test clock signal TST_CLK2, and changes the states of the output signals (a test control signal TCMD, a test address TAD and test write data TDin).

The output signals of latch circuit 1a are maintained for one clock cycle of internal test clock signal TST_CLK2.

Latch circuit 1d which is a down-edge trigger latch circuit, for example, latches applied signals in response to a falling edge of internal test clock signal TST_CLK2. Therefore, the output signals of latch circuit 1d (TIFCMD, TIFAD and TIFDin) change in synchronization with a fall of internal test clock signal TST_CLK2.

By thus utilizing latch circuits 1a and 1d, an internal command INCMD, an internal address INADD and internal write data INDin can be transferred to DRAM core MCR in synchronization with internal test clock signal TST_CLK2 having a frequency twice as high as external test clock signal TST_CLK.

Latch circuit 1a is supplied with external input signals such as test control signal TCMD from a memory tester or the like through test pin terminals TPG at timing synchronous to external test clock signal TST_CLK and before internal test clock signal TST_CLK2 rises. For the external input signals, setup time tIS and hold time tIH are defined.

Figure 5:
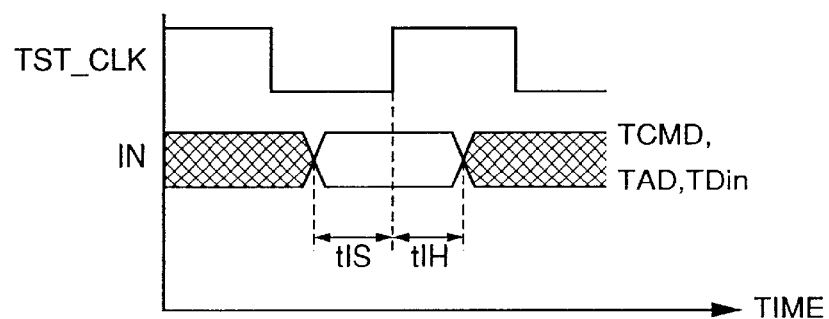
FIG. 5 shows relations between external signals and an external test clock signal input to test terminals TPG.

FIG. 5 shows relations between the external signals and the external test clock signal input to test terminals TPG. In FIG. 5, test control signal TCMD, test address TAD and test write data TDin input to test pin terminals TPG are collectively referred to as an external input signal IN.

Referring to FIG. 5, external input signal IN is kept in a valid state from timing earlier by setup time tIS than a rising edge of external test clock signal TST_CLK of a memory tester to timing later than the rising edge by hold time tIH. Setup time tIS and hold time tIH are required so that the test interface circuit correctly captures the external input signals and generates internal signals corresponding to applied external input signal IN.

In the first embodiment, setup time tIS and hold time tIH of external input signal IN may be at most ¼ times as long as the cycle of external test clock signal TST_CLK. If external input signal IN is input in synchronization with internal test clock signal TST_CLK2 which corresponds to an actual operating frequency of DRAM core MCR, setup time tIS and hold time tIH of external input signal IN have to be at most ¼ times as long as the cycle of internal test clock signal TST_CLK2, that is, at most ⅛ times as long as the cycle of external test clock signal TST_CLK. In comparison, it is appreciated that a high frequency operational test for DRAM core MCR is made possible by using a lower speed memory tester.

It is noted in the first embodiment that a successive operational test with read command READ and write command WRITE in a paging operation is not performed.

Then, data reading from DRAM core MCR will be described.

Referring again to FIG. 1, read data RD is output after column latency CL of DRAM core MCR stored in mode register 2 since read command READ is generated. CA shifter 3 generates a read data selection signal RD_S at timing based on latency CL held in mode register 2 to meet timing at which the read data is output.

In response to read data selection signal RD_S, read data selection circuit 4 selects 8 bits from 256-bit read data TIFDout transmitted to the test interface circuit, and sends the bits to data shifter 20. According to timing control signal Q generated by mode register 2, data shifter 20 delays the data by N clock cycles (N is an integer of at least 0) of internal test clock signal TST_CLK2, and outputs output data TDout to test pin terminals TPG.

Since a successive operational test is not performed in the first embodiment, timing control signal Q is set according to latency CL which is set for DRAM core MCR. By thus adjusting the shift amount of data shifter 20 using timing control signal Q, test output data TDout can be output from test pin terminals TPG in synchronization with external test clock signal TST_CLK. As a result, a memory tester can obtain test output data from the DRAM core.

Figure 6:
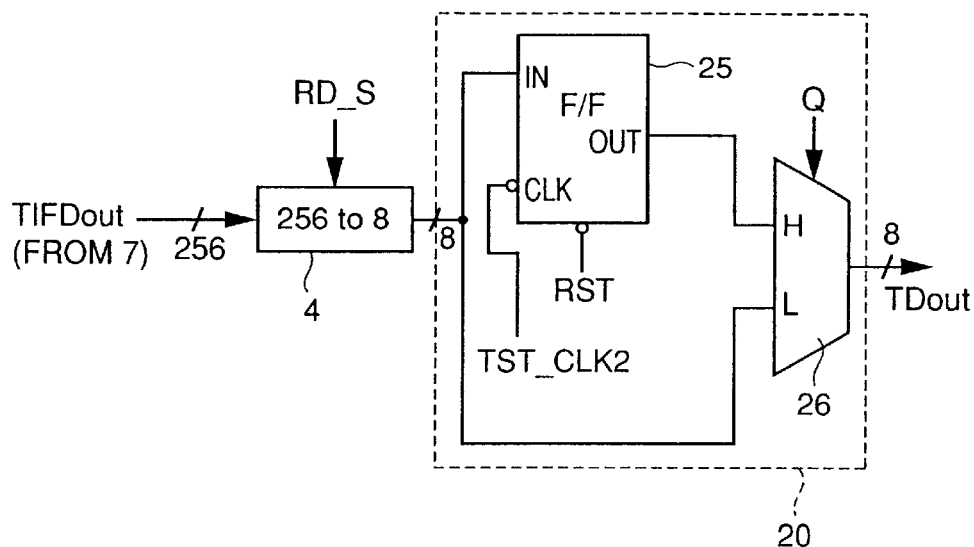
FIG. 6 is a circuit diagram showing a configuration example of a data shifter 20.

Referring to FIG. 6, data shifter 20 has a flip-flop 25 operating in synchronization with internal test clock signal TST_CLK2. Flip-flop 25 receives read data output from read data selection circuit 4, and outputs the data in response to a falling edge of internal test clock signal TST_CLK2. Thus, the output signal of flip-flop 25 is a signal shifted from the read data of read data selection circuit 4 by one clock cycle. Flip-flop 25 has a reset terminal, and can reset its output when a reset signal RST is activated (to logic low).

Data shifter 20 further has a selector 26 receiving outputs from flip-flop circuit 25 and read data selection circuit 4 and outputting one of them as test output data TDout according to timing control signal Q. Although detailed operating timing will be described below, selector 26 outputs the output of flip-flop 25 as test output data TDout when CL=2. On the other hand, when CL=1, selector 26 outputs the output of read data selection circuit 4 as test output data TDout.

Figure 7:
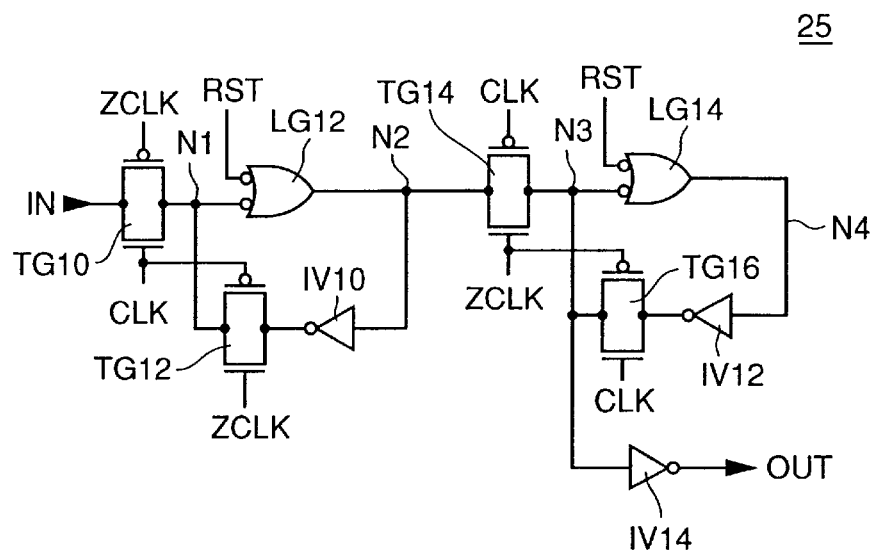
FIG. 7 is a circuit diagram showing a configuration example of a flip-flop 25.

Referring to FIG. 7, flip-flop 25 has a transfer gate TG10 connected between an input node IN receiving the output of read data selection circuit 4 and an internal node N1, a logic gate LG12 outputting to an internal node N2 an NAND logic operation result between signal levels of internal node N1 and reset signal RST, an inverter IV10 inverting a signal level of internal node N2, and a transfer gate TG12 connected between inverter IV10 and internal node N1.

Flip-flop 25 further has a transfer gate TG14 connected between internal node N2 and an internal node N3, a logic gate LG14 outputting to an internal node N4 an NAND logic operation result between signal levels of internal node N3 and reset signal RST, an inverter IV12 inverting a signal level of internal node N4, a transfer gate TG16 connected between inverter IV12 and internal node N3, and an inverter IV14 inverting a signal level of internal node N3 and outputting it to an output node OUT. Output node OUT of flip-flop 25 is connected to an input node on the H side of selector 26.

Transfer gates TG10 and TG16 turn on according to the logic high level of clock signal CLK, and transfer gates TG12 and TG14 operate in response to the logic low level of clock signal CLK. Therefore, transfer gates TG10 and TG16 turn on/off at the same timing, and transfer gates TG12 and TG14 turn on/off complementarily to transfer gates TG10 and TG16. Since clock signals applied to clock terminals are generically denoted as CLK in FIG. 7, clock signal CLK and its inversion signal ZCLK correspond to internal test clock signal TST_CLK2 and its inversion signal, respectively, for flip-flop 25.

By activating reset signal RST to logic low according to such a configuration, the signal levels of internal nodes N2 and N4 are fixed to logic high, and the signal levels of internal node N3 and output node OUT are fixed to logic low and logic high, respectively. This corresponds to a reset state.

When the reset signal is inactive (logic high), a signal transmitted to input node IN in synchronization with clock signal CLK and its inversion signal ZCLK by transfer gates TG10, TG16 and TG12, TG14 turning on/off complementarily is output from output node OUT, delayed by one clock cycle of clock signal CLK. Inverters IV10 and IV12 are provided to latch the signal levels of internal node N1 to N4.

In the following, an operation of the test interface circuit according to the first embodiment of the present invention will be described with reference to the timing charts of FIGS. 8 and 9.

Figure 8:
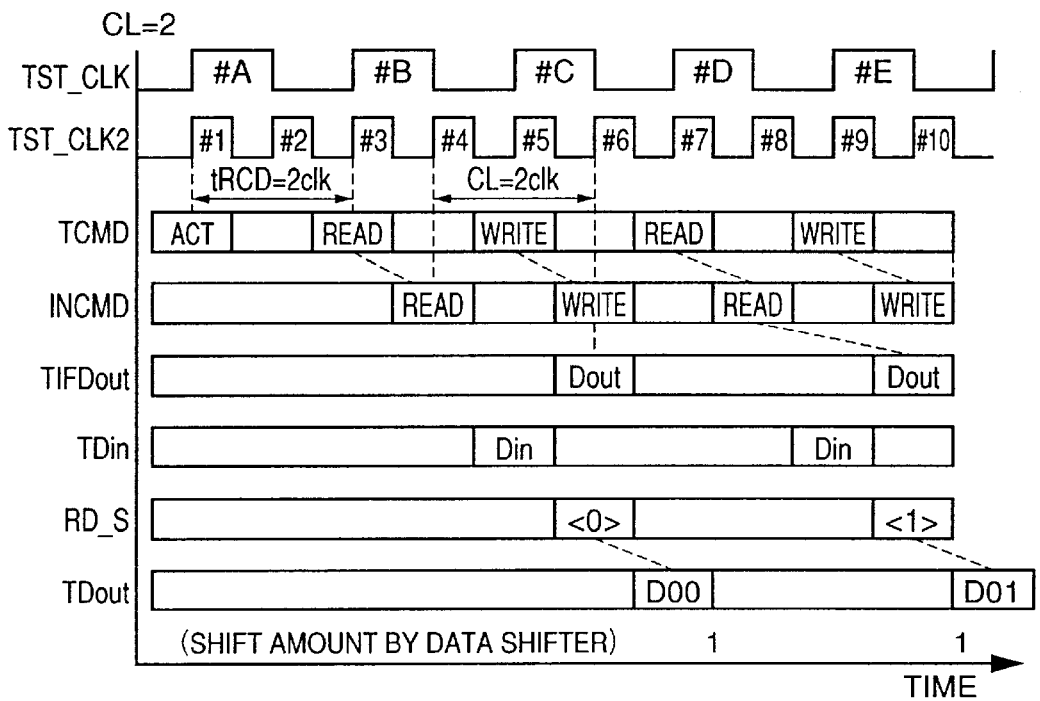
FIG. 8 is a first timing chart illustrating an operation of a test interface circuit according to the first embodiment of the present invention.
Figure 9:
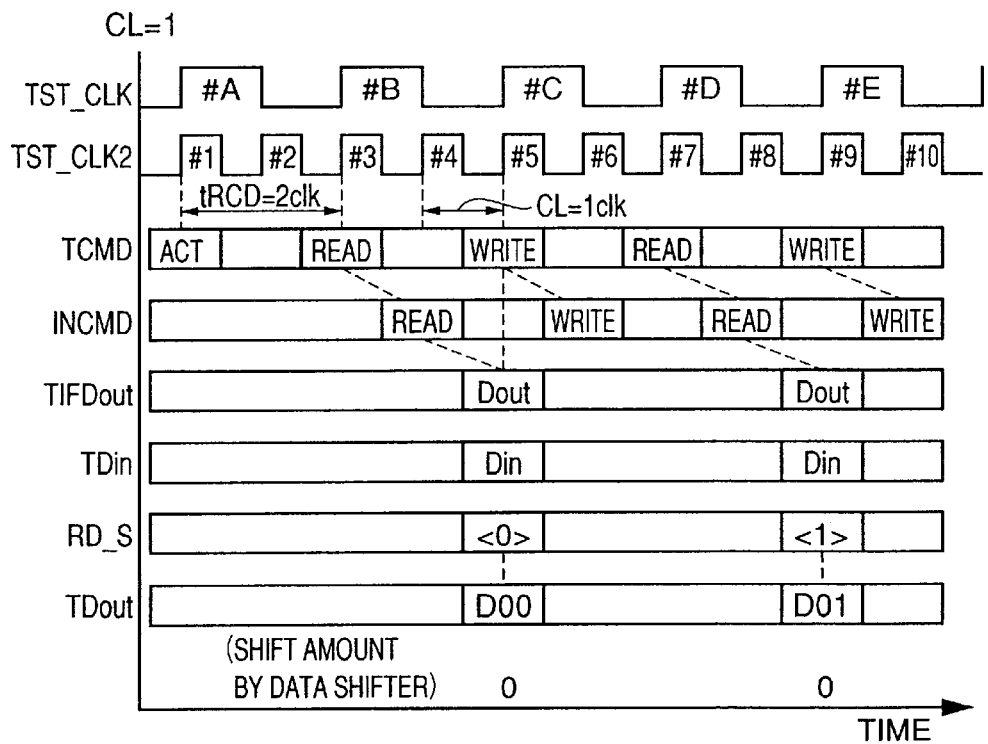
FIG. 9 is a second timing chart illustrating an operation of the test interface circuit according to the first embodiment of the present invention.

FIG. 8 illustrates the case of CL=2 and FIG. 9 illustrates the case of CL=1 for DRAM core MCR.

In the following, the clock cycles of external clock signal TST_CLK are denoted by #A, #B, #C, . . . , and the clock cycles of internal test clock signal TST_CLK2 are denoted by #1, #2, #3, . . . .

Referring to FIG. 8, test control signal TCMD is input to test pin terminals TPG in response to a rising edge of external test clock signal TST_CLK which is an operational clock signal of a memory tester, for example. As described above, in the first embodiment, setup time tIS and hold time tIH of the test control signal are at most ¼ times as long as the cycle of external test clock signal TST_CLK. Therefore, test control signal TCMD is input at timing synchronous to a rising edge of external test clock signal TST_CLK.

In clock cycles #A and #B, an activate command ACT and a read command READ are supplied from the memory tester. Test control signal TCMD specifying the read command is captured by latch/command decoder 1 at the rising edge in clock cycle #3. In response, latch/command decoder 1 generates, at the falling edge in clock cycle #3, a control signal for specifying read command READ for DRAM core MCR. The control signal is applied, in clock cycle #4, as an internal control signal INCMD to DRAM core MCR from test interface circuit TICa through selector 5.

Since CL=2, 256-bit read data Dout from DRAM core MCR is transmitted to test interface circuit TICa in clock cycle #6 which is two clock cycles after clock cycle #4. Read data selection signal RD_S (<0>) is generated by CA shifter 3 in synchronization with transmission timing of the bit data. In response, 8-bit read data D00 is selected by read data selection circuit 4.

However, in the case of CL=2, read data D00 is validated in clock cycle #6 which corresponds to a falling edge of external test clock signal TST_CLK. Therefore, read data D00 needs to be delayed by one clock cycle of internal test clock signal TST_CLK2. In the case of column latency CL=2, the shift amount of the data shifter needs to be set at "1" (one clock cycle of TST_CLK2).

Therefore, in the case of CL=2, timing control signal Q is set to the logic high level and, in data shifter 20 shown in FIG. 6, the outputs of flip-flop 25 is transmitted as test output data TDout to test pin terminals TPG. As a result, test output data D00 is output as test output data TDout from test pin terminals TPG in clock cycle #7 which corresponds to a rising edge of the external test clock signal in #D.

In clock cycle #C, test control signal TCMD for specifying write command WRITE and 8-bit test write data Din are input from the memory tester to test interface circuit TICa. Test control signal TCMD is captured by latch/command decoder 1 at the rising edge in clock cycle #5 and, at the falling edge in clock cycle #5, latch/command decoder 1 generates a control signal for specifying write command WRITE for DRAM core MCR. The control signal is applied as internal control signal INCMD to DRAM core MCR in clock cycle 6.

Test write data TDin is converted by bit width expansion circuit 1c in latch/command decoder 1 and written to DRAM core MCR in clock cycle #6.

Although the next read command READ and write command WRITE are specified by the memory tester in clock cycles #D and #E, an operation for the test control signals is similar to the above described operation in clock cycles #B and #C and description thereof will not be repeated.

In the following, an operation in the case of CL=1 may be described with reference to FIG. 9.

Test control signal TCMD input from the memory tester to test pin terminals TPG in FIG. 9 is similar to the case of FIG. 8.

In clock cycle #B, in response to test control signal TCMD for specifying read command READ being input from the memory tester, latch/command decoder 1 generates internal control signal INCMD for specifying read command READ for DRAM core MCR in clock cycle #4. This is similar to the case of FIG. 8.

However, in the case of CL=1, in clock cycle #5 which is one clock cycle after clock cycle #4 in which the READ command is generated, read data Dout from DRAM core MCR is transmitted to test interface circuit TICa. To meet this timing, CA shifter 3 generates read data selection signal RD_S (<0>) at timing one clock cycle earlier than the case of FIG. 8, and applies the signal to read data selection circuit 4.

In response to read data selection signal RD_S (<0>), read data selection circuit 4 selects 8-bit read data D00 from 256-bit read data Dout from the DRAM core MCR.

In the case of column latency CL=1, read data selection circuit 4 outputs read data D00 in clock cycle #5 which corresponds to the rising edge of the external test clock signal in clock cycle #C. Therefore, read data D00 may be output as test output data TDout from test pin terminal TPG without adjusting the timing in data shifter 20.

Therefore, in the case of CL=1, timing control signal Q is set to the logic low level and, in data shifter 20 shown in FIG. 6, the output of read data selection circuit 4 is transmitted as test output data TDout to test pin terminals TPG. As a result, read data D00 is output as test output data TDout from test pin terminals TPG in clock cycle #7 which corresponds to the rising edge of the external test clock signal in #D.

Since an internal operation for write command WRITE is similar to the case of FIG. 8, description thereof will not be repeated.

Even for read command READ input in clock cycle #D, data is read out at similar timing, and read data D01 is output as test output data TDout from test pin terminals TPG at timing synchronous to clock cycle #9, that is, clock cycle #E.

As described above, in the semiconductor integrated input circuit device according to the first embodiment, the use of the memory tester generating an external test clock signal enables the direct memory access test for a DRAM core to be performed at a frequency twice as high as the external test clock signal, and test data from the DRAM core to be captured by the memory tester in synchronization with the external test clock signal. Furthermore, whether the frequency of the external test clock signal is multiplied or not in the direct memory access test for the DRAM core can be set by a selection signal input to the test clock control terminal.

Second Embodiment

Figure 10:
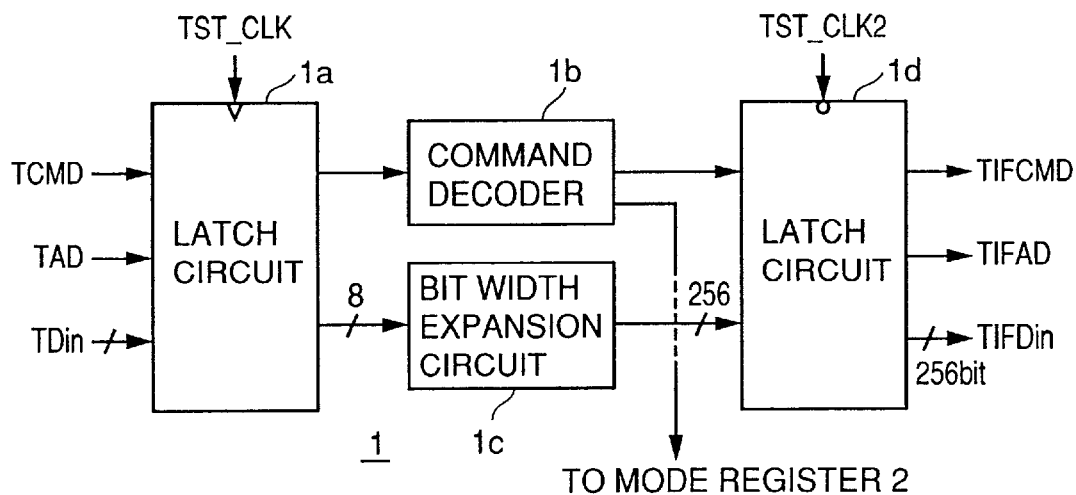
FIG. 10 shows a configuration of a latch/command decoder 1 according to a second embodiment of the present invention.

Referring to FIG. 10, a circuit configuration of latch/command decoder 1 according to a second embodiment of the present invention is similar to the case of the first embodiment shown in FIG. 4. However, latch command decoder 1 in the second embodiment is different from that in the first embodiment in that a latch circuit 1a receiving a test control signal TCMD, a test address TAD and test write data TDAin from test pin terminals TPG operates in synchronization not with an internal test clock signal TST_CLK2 but with an external test clock signal TST_CLK.

Since configurations and operations of other portions of the test interface circuit, a selector 5, gate circuits 6, 7 and a DRAM core MCR are similar to those in the first embodiment, description thereof will not be repeated.

Figure 11:
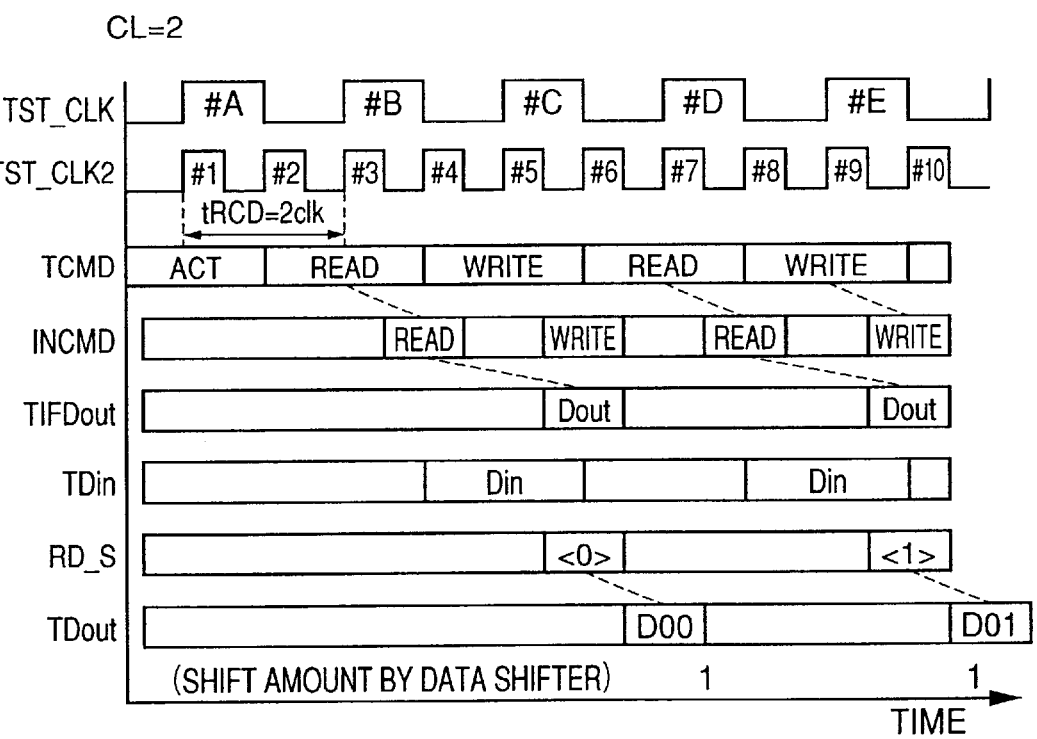
FIG. 11 is a timing chart illustrating an operation of a test interface circuit according to the second embodiment.

An operation of the test interface circuit according to the second embodiment will be described with reference to the timing chart of FIG. 11. In FIG. 11, the case of CL=2 is illustrated.

Referring to FIG. 11, test command control signal TCMD is captured by latch circuit 1a operating in synchronization with external test clock signal TST_CLK. Therefore, in contrast to FIGS. 8 and 9, setup time tIS and hold time tIH can be lengthened. In other words, setup time tIS and hold time tIH of the test control signal may be at most ½ times as long as the cycle of external test clock signal TST_CLK.

In clock cycles #A and #B, test control signal TCMD for specifying an activate command ACT and a read command READ is input to test pin terminals TPG in response to a rising edge of external test clock signal TST_CLK.

Test control signal TCMD for specifying the read command is captured by latch/command decoder 1 in clock cycle #B. In response, latch/command decoder 1 generates, at the falling edge in clock cycle #3, a control signal for specifying read command READ for DRAM core MCR. In clock cycle #4, the control signal is applied as an internal control signal INCMD to DRAM core MCR from test interface circuit TICa through a selector 5.

Since an internal operation for DRAM core MCR after latch circuit 1d in latch/command decoder 1 in the second embodiment is similar to the case of the first embodiment, description thereof will not be repeated.

Similarly, in clock cycle #C, test control signal TCMD for specifying write command WRITE and 8-bit test write data Din are input from the memory tester to the test interface circuit and captured by latch command decoder 1. At the falling edge in clock cycle #5, latch/command decoder 1 generates a control signal for specifying write command WRITE for DRAM core MCR. The control signal is applied as internal control signal INCMD to DRAM core MCR in clock cycle #6.

Even for data writing, an internal operation for DRAM core MCR after a latch circuit 1d in latch/command decoder 1 is similar to the case of the first embodiment. Therefore, description thereof will not be repeated.

An operation for read command READ and write command WRITE specified from the external memory tester in clock cycles #D and #E is also similar to the internal operation corresponding to clock cycles #B and #C.

By thus operating latch circuit 1a capturing the external input signal from the memory tester in latch/command decoder 1 in synchronization with external test clock signal TST_CLK, a direct memory access test similar to the case of the test interface circuit according to the first embodiment can be performed while lengthening the setup time and the hold time of the input signal from the external memory tester. It is therefore possible to lower the speed of memory tester which carries out a direct memory access test for the semiconductor integrated circuit device according to the present invention.

Third Embodiment

In a third embodiment, a configuration allowing a successive operation synchronous to an internal test clock signal TST_CLK2 for DRAM core MCR will be described.

A test interface circuit according to the third embodiment is different from the configuration of test interface circuit TICa according to the first embodiment shown in FIG. 1 in that a data shifter 120 is provided instead of data shifter 20 and a timing control signal Q is a signal of multiple bits. Since configurations and operations of other test interface circuit portion, DRAM core MCR, a selector 5 and gate circuits 6, 7 are similar to the case of the first embodiment, description thereof will not be repeated.

Figure 12:
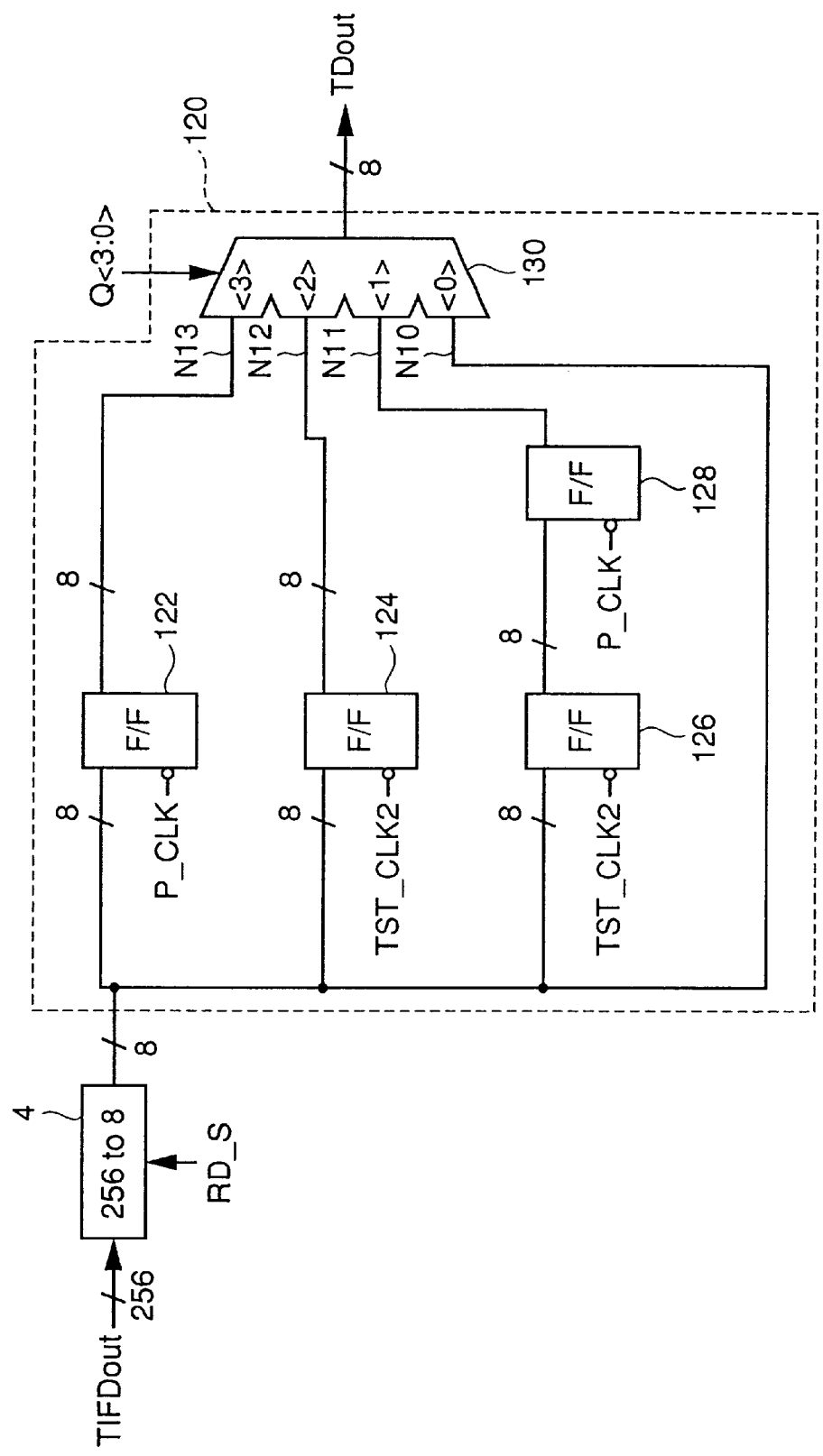
FIG. 12 is a circuit diagram showing a configuration of a data shifter 120 used in a test interface circuit according to a third embodiment of the present invention.

Referring to FIG. 12, data shifter 120 used in a test interface circuit according to the third embodiment of the present invention includes flip-flops 122 and 128 operating in synchronization with the clock signal P_CLK described with reference to FIG. 2, which is generated by delaying the phase of external test clock signal TST_CLK by 90° (¼ cycle), flip-flops 124 and 126 operating in synchronization with an internal test clock signal TST_CLK2, and a selector 130.

Flip-flops 122, 124 and 126 receive read data output from read data selection circuit 4. Outputs of flip-flops 122 and 124 are transmitted to internal nodes N13 and N12, respectively. Flip-flop 128 is connected in series with flip-flop 126 between read data selection circuit 4 and an internal node N11. An output of flip-flop 128 is transmitted to internal node N11. For an internal node N10, read data output from read data selection circuit 4 is directly transmitted without passing through the flip-flops.

In response to 4-bit timing control signal Q<0> to Q<3>, selector circuit 130 outputs as test output data TDout data transmitted to one of internal nodes N10, N11, N12 and N13. It is noted that timing control signal Q<3> to Q<0> is also generically denoted as Q<3:0>.

One bit of timing control signal Q<3:0> is selectively activated according to the value of column latency CL of DRAM core MCR and to a cycle in which a read command is specified for the DRAM core (hereinafter, also referred to as a read specified cycle). The read specified cycle is represented by the number of cycles of TST_CLK2.

Specifically, when CL=2 and only a read command is successively specified (the read specified cycle is one clock cycle), Q<3> is activated and selector 130 outputs output data of flip-flop 122 as test output data TDout to test pin terminals TPG. When CL=2 and a read command and a write command are alternately and successively specified (the read specified cycle is two clock cycles), Q<2> is activated and selector 130 outputs output data of flip-flop 124 as test output data TDout to test terminals TPG. When CL=1 and only a read command is successively specified (the read specified cycle is one clock cycle), Q<1> is activated and selector 130 outputs an output of flip-flop 128 as test output data TDout to test pin terminals TPG. When CL=1 and a read command and a write command are alternately specified, Q<0> is activated and selector 130 outputs the output of read data selection circuit 4 as a test read signal TDout from test pin terminals TPG without passing it through the flip-flops.

In the following, an operation of data shifter 120 shown in FIG. 12 will be described in detail based on the timing charts of FIGS. 13 to 16.

Figure 13:
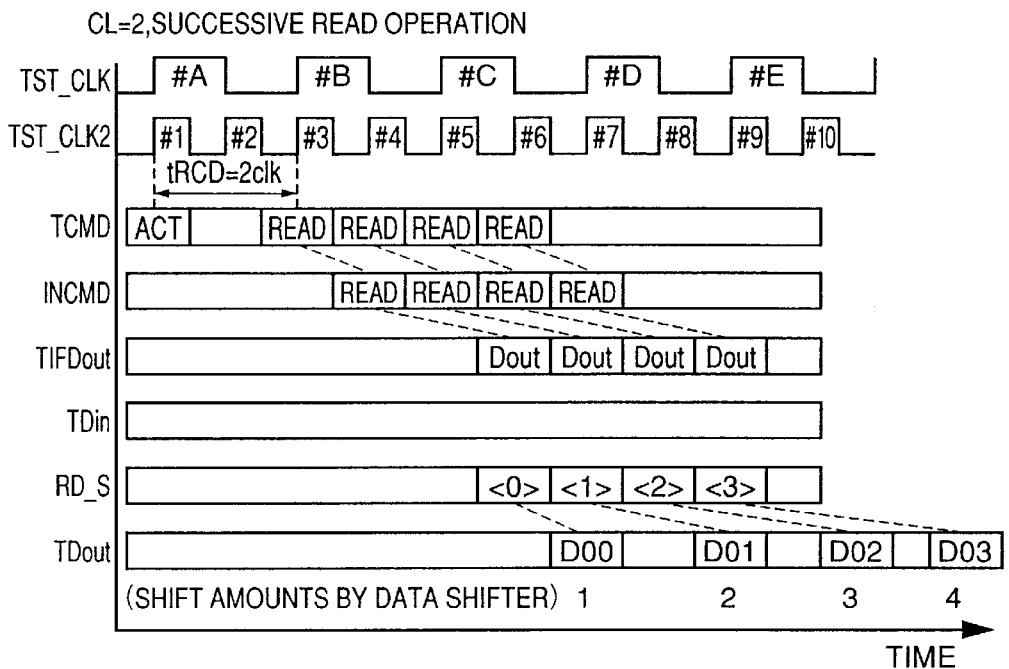
FIG. 13 is a first timing chart illustrating an operation of the test interface circuit according to the third embodiment.

FIG. 13 illustrates an operation of the test interface circuit when CL=2 and only the read command is successively specified.

Referring to FIG. 13, by setting setup time tIS and hold time tIH of test control signal TCMD to be at most ¼ times as large as the cycle of external test clock signal TST_CLK, test control signal TCMD can be captured in synchronization with both rising and falling edges of external test clock signal TST_CLK. Thus, an internal command can be generated in each clock cycle of internal test clock signal TST_CLK2.

In FIG. 13, at both the rising and falling edges in clock cycles #B and #C, test control signal TCMD for specifying read command READ is applied from the memory tester, and this is captured to generate an internal control signal INCMD for specifying read command READ for DRAM core MCR in clock cycles #4 to #7. Since CL=2, corresponding read data Dout is output from DRAM core MCR in response to this internal command in clock cycles #6 to #9, and the data is transmitted to the test interface circuit.

In synchronization with the timing, read data selection signal RD_S (<0> to (3>) is supplied from CA shifter 3 to read data selection circuit 4 in each of clock cycles #6 to #9. In each of clock cycles #6 and #9, read data selection circuit 4 outputs 8-bit test output data D00 to D03 corresponding to read data selection signal RD_S (<0> to (<3>) from 256-bit read data applied from DRAM core MCR.

In order to output read data D00–D03 output from read data selection circuit 4 in synchronization with external test clock signal TST_CLK as described above, the shift amount of data shifter 120 has to be set to one clock cycle, two clock cycles, three clock cycles and four clock cycles of internal test clock cycles TST_CLK2 corresponding to test output data D00–D03, respectively.

When CL=2 and only the read command is successively specified, timing control signal Q<3> is activated and therefore the output of flip-flop 122 is output as test output data TDout. Since flip-flop 122 operates in response to a falling edge of clock signal P_CLK which is generated by delaying the phase of external test clock signal TST_CLK by 90° (¼ cycle), the output signal from read data selection circuit 4 is transmitted to selector 130 in response to each falling edge in clock cycles #6, #8, #10, . . . Therefore, the output signal from read data selection circuit 4 can be read out through test pin terminals TPG at timing synchronous to external clock signal TST_CLK.

Figure 14:
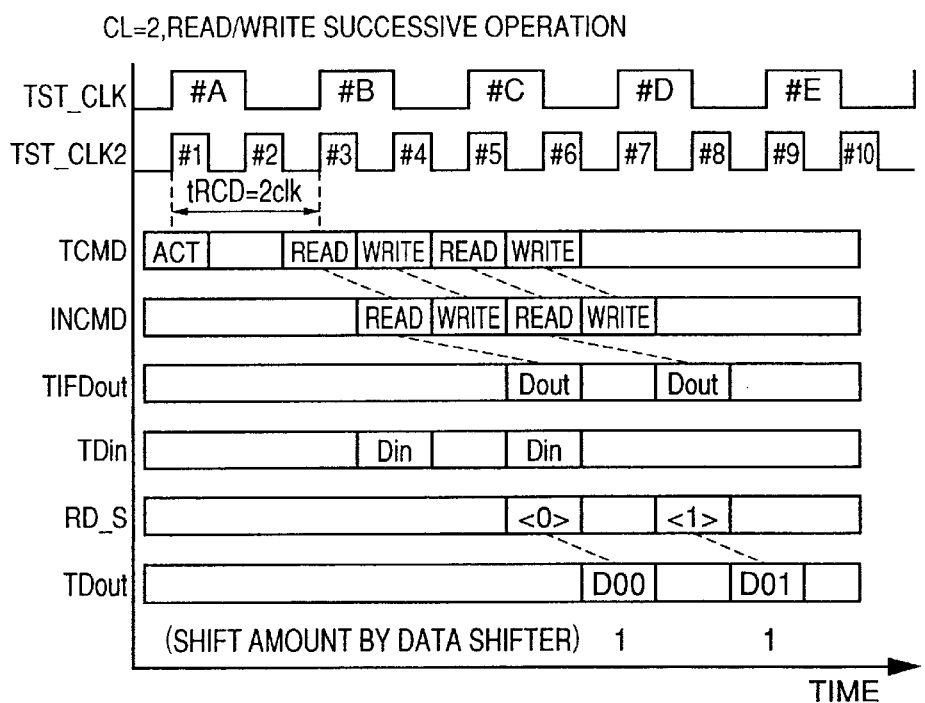
FIG. 14 is a second timing chart illustrating an operation of the test interface circuit according to the third embodiment.

FIG. 14 illustrates an operation of the test interface circuit when CL=2 and the read command and the write command are alternately and successively specified.

In the case of FIG. 14, the internal command is also generated successively in clock cycles #3 to #6. In FIG. 14, read command READ and write command WRITE are alternately specified differently from the case of FIG. 13.

First, data reading corresponding to read command READ applied from the memory tester at timing corresponding to clock cycle #3 will be described. For read command READ input from the memory tester at the rising edge in clock cycle #B, internal control signal INCMD for specifying read command READ for DRAM core MCR is generated in clock cycle #4. In response, read data from DRAM core MCR is transmitted to the test interface circuit in clock cycle #6 after two clock cycles corresponding to the column latency CL. To meet the timing, CA shifter 3 also supplies read data selection signal RD_S to read data selection circuit 4, and read data selection circuit 4 selectively outputs 8-bit test output data D00 from 256-bit read data Dout.

In order to output test output data D00 from test pin terminals TPG in synchronization with external clock signal TST_CLK, output data is delayed by one clock cycle of internal test signal TST_CLK2 in data shifter 120.

By a similar operation, test output data D01 corresponding to read command READ which corresponds to an internal control signal generated at the timing of clock cycle #6 is also output from read data selection circuit 4 in clock cycle #8.

When the read command and the write command are alternately and successively specified as described above (the read specified cycle is two clock cycles), a plurality of pieces of test output data will not be generated in one clock cycle of external test clock signal TST_CLK. Therefore, test output data TDout will not be generated closely as in the case of FIG. 13. As a result, considering only column latency CL, the shift amount of data shifter 120 is always set to one clock cycle of internal test clock signal TST_CLK2 similarly to FIG. 8.

Therefore, when CL=2 and the read command and the write command are alternately and successively specified, timing control signal Q<2> is activated and the output of flip-flop 124 operating in synchronization with a falling edge of internal test clock signal TST_CLK2 is output as test output data TDout. Thus, the test output data from read data selection circuit 4 can be always output with the shift amount of one clock cycle of TST_CLK2.

Figure 15:
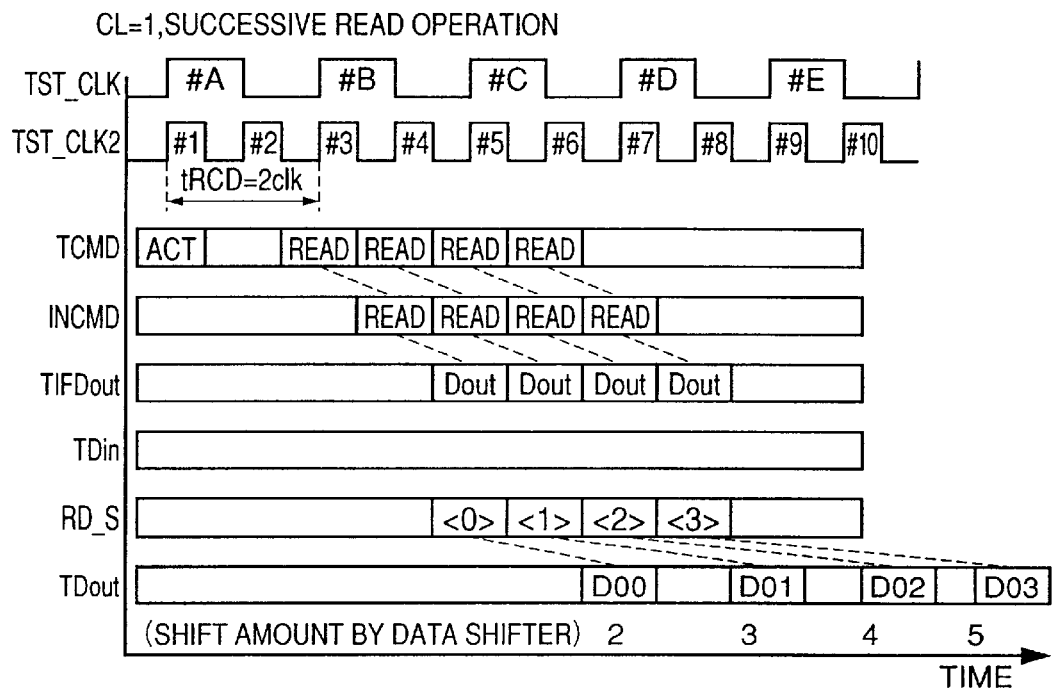
FIG. 15 is a third timing chart illustrating an operation of the test interface circuit according to the third embodiment.

FIG. 15 illustrates an operation of the test interface circuit when CL=1 and only the read command is successively specified.

Referring to FIG. 15, the timing at which test control signal TCMD from the memory tester is captured and internal control signal INCMD is generated is similar to the case of FIG. 13. Since CL=1, however, read data from DRAM core MCR is sequentially transmitted to the test interface circuit at timing earlier than in the case of FIG. 13 by one clock cycle, starting from clock cycle #5. In response, read data selection circuit 4 outputs test output data D00 to D03. In this case, it is necessary to carry out data shifting for each one clock cycle of internal test clock signal TST_CLK2 in contrast to the case of FIG. 13.

When CL=1 and only the read command is successively specified, timing control signal Q<1> is activated and the output of flip-flop 128 is output as test output data TDout. Since flip-flop 128 receives the output of flip-flop 126 operating in response to a falling edge of internal test clock signal TST_CLK2 and outputs the output of flip-flop 126 in response to a falling edge of clock signal P_CLK, the output of flip-flop 128 is a signal shifted by one clock cycle of internal test clock signal TST_CLK2 as compared with the output of flip-flop 122.

Therefore, the shift amount corresponding to the case where CL=1 and only the read command is successively specified because of flip-flops 126 and 128 can be applied by data shifter 120.

Figure 16:
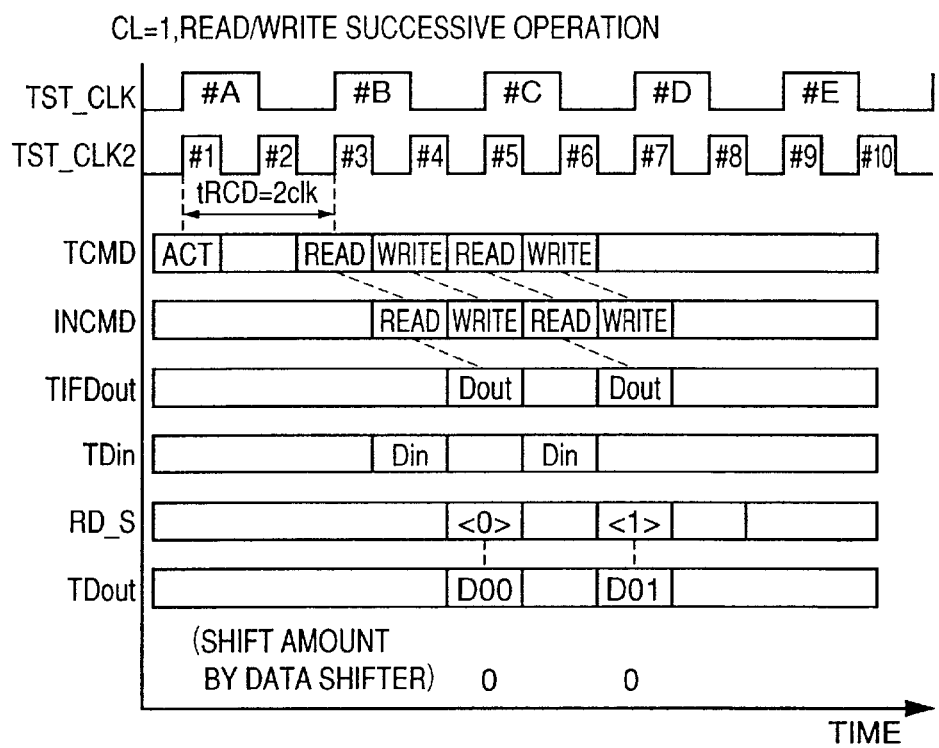
FIG. 16 is a fourth timing chart illustrating an operation of the test interface circuit according to the third embodiment.

FIG. 16 illustrates an operation of the test interface circuit when CL=1 and the read command and the write command are alternately and successively specified.

Referring to FIG. 16, the timing at which test control signal TCMD from the memory tester is captured and internal control signal INCMD is generated is similar to the case of FIG. 14. Since CL=1, however, read data from DRAM core MCR is sequentially transmitted to the test interface circuit at timing earlier than in the case of FIG. 13 by one clock cycle. Thus, read data selection circuit 4 outputs test output data D00 and D01 in clock cycles #5 and 7, respectively.

As described above, when the read command and the write command are alternately and successively specified, the shift amount of data shifter 120 may be set considering only column latency CL.

Therefore, the shift amount of data shifter 120 may be set similarly to the case of FIG. 9, and the timing at which test output data D00 and D01 are output by read data selection circuit 4 is the one corresponding to a rising edge of external clock signal TST_CLK. In data shifter 120, therefore, the output of read data selection circuit 4 may be output to test pin terminals TPG without carrying out data shifting.

Thus, when CL=1 and the read command and the write command are alternately and successively specified, timing control signal Q<0> is activated and selector 130 directly outputs the output of read data selection circuit 4 as test output data Dout without passing it through the flip-flops.

By thus setting the shift amount of data shifter 120 based on the value of column latency CL and the relationship between a period in which the read command is specified to the DRAM core and a period of the external test clock signal, the READ/WRITE command for DRAM core MCR can be successively generated in synchronization with internal test clock signal TST_CLK2 to perform the reading/writing successive testing in a paging operation and test output data can be captured by memory tester from outside at timing synchronous to external clock signal TST_CLK in the test interface circuit according to the third embodiment.

Fourth Embodiment

Figure 17:
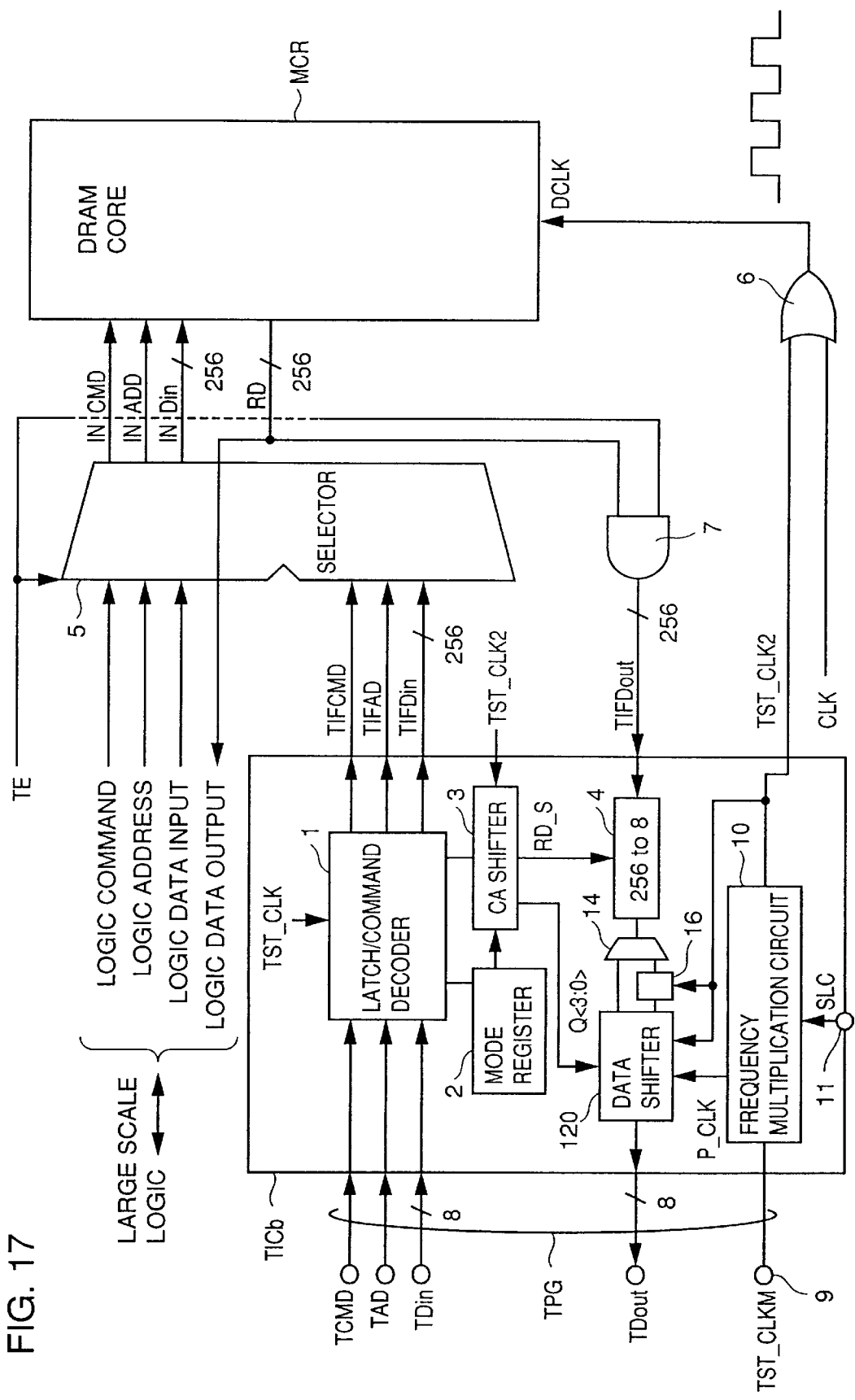
FIG. 17 schematically shows a configuration of a main part of a semiconductor integrated circuit device according to a fourth embodiment of the present invention.

Referring to FIG. 17, a test interface circuit TICb according to a fourth embodiment is different from test interface circuit TICa shown in the embodiment in that a data shifter 120 according to the third embodiment is provided instead of a data shifter 20 and a selector 14 and a data judgement circuit 16 are further included between a read data selection circuit 4 and data shifter 120. Since other portions and operation of the test interface circuit are similar to the test interface circuit TICa according to the first embodiment, description thereof will not be repeated.

Figure 18:
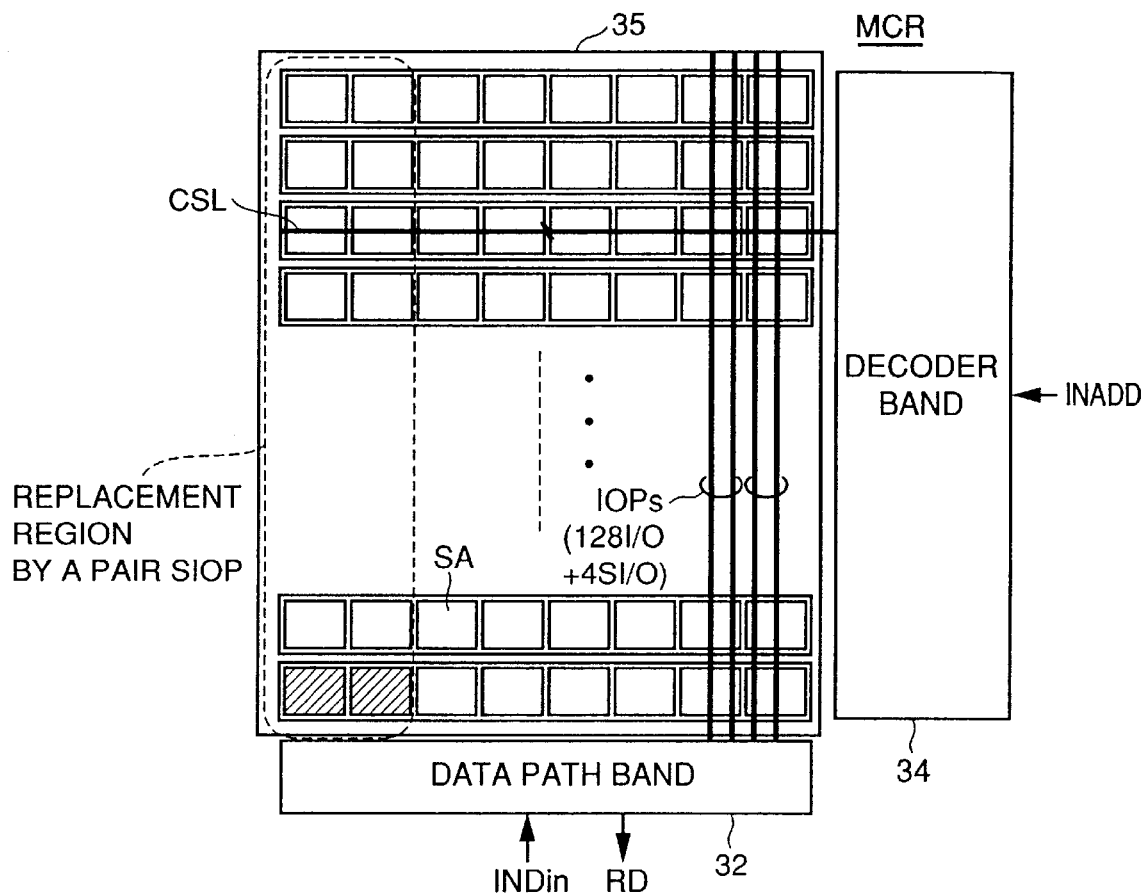
FIG. 18 is a block diagram showing one example of a configuration of a DRAM core MCR.

FIG. 18 shows a configuration of a DRAM core having an I/O line replacement type spare column. Referring to FIG. 18, DRAM core MCR includes a memory cell array 35 having a plurality of memory cells arranged in a matrix, a decoder band 34 selecting a memory cell in memory cell array 35 according to an internal address INADD, and a data-path band 32 performing data reading/writing against memory cell array 35.

Memory cell array 35 is divided into a plurality of subarrays SA arranged in a matrix. In memory cell array 35, read/written data is transmitted by I/O line pairs IOPs. I/O line pairs IOPs include 128 normal I/O line pairs and 4 spare I/O line pairs, for example. In FIG. 18, eight columns of subarrays SA are arranged in memory cell array 35, and sixteen normal I/O line pairs are provided corresponding to one subarray SA. In addition, a replacement region for one spare I/O line pair corresponds to two columns of subarrays SA.

Figure 19:
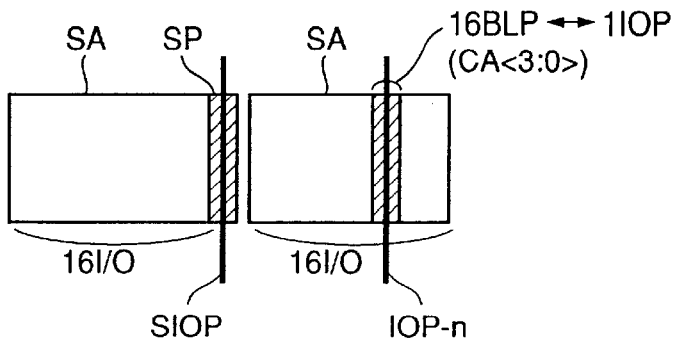
FIG. 19 is a view illustrating correspondence between a subarray SA and I/O lines.

Referring to FIG. 19, sixteen normal I/O line pairs are provided for one subarray SA. If one of the normal I/O line pairs is expressed by IOP-n, IOP-n corresponds to sixteen bit line pairs BLP. In short, 4-bit column address CA<3:0> causes one among sixteen bit line pairs BLP to be selected in each normal I/O line pair, and to be connected to a corresponding normal I/O pair IOP-n.

A spare I/O line pair SIOP is provided to be able to replace a normal I/O line pair in two subarrays. Therefore, a defective memory cell is repaired in a redundancy manner by replacing each normal I/O line pair with a corresponding spare I/O line pair. In memory cell array 35, sixteen bit line pairs selected by column address CA<3:0> is thus a unit of replacement.

As described above, during testing, by incrementing column address CA<3:0> and comparing maximum 16-bit data successively read out in order of time from one normal I/O line pair with an expected value, it can be determined whether the normal I/O line pair should be replaced.

Here, the test data can be output efficiently by compressing data based on the result of identity comparison with the expected value.

For example, if data of an identical level is written as test data to memory cells corresponding to a single replacement unit and the data is read out to detect whether the memory cells are normal or not, the existence of a defect in the replacement unit can be found out by identity comparison between test output data.

Figure 20:
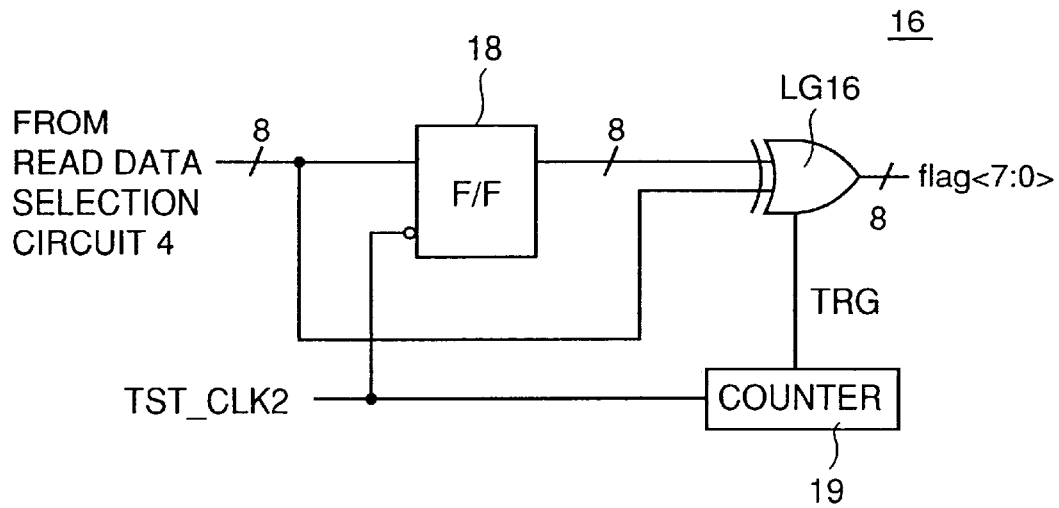
FIG. 20 is a circuit diagram showing a configuration of a data determination circuit 16.

Referring to FIG. 20, data determination circuit 16 has a flip-flop 18 receiving test output data from read data selection circuit 4 through selector 14, a logic gate LG16 performing identity comparison between an output of flip-flop 18 and the test output data from read data selection circuit 4, and a counter 19 receiving an internal test clock signal TST_CLK2.

Flip-flop 18 transmits the test output data from read data selection circuit 4 to one input node of logic gate LG16 in response to a falling edge of internal test clock signal TST_CLK2. Flip-flop 18 shifts the test output data by one clock cycle of internal test clock signal TST_CLK2. The other input node of logic gate LG16 is directly supplied with the test output data from read data selection circuit 4 without using the flip-flop. That is, 8-bit test output data is input to the respective input nodes of logic gate LG.

Counter 19 activates trigger TRG for a prescribed time period in response to two clock cycles of internal test clock signal TST_CLK2 being elapsed. The two clock cycles correspond to a case where the frequency is raised two times in a frequency multiplication circuit 10.

Logic gate LG16 is responsive to activation of trigger TRG to output an 8-bit judgement flag<7:0> which indicates an identity comparison result of data levels in each bit between the 8-bit test output data transmitted to the input nodes.

In the following, an operation of the test interface circuit according to the fourth embodiment will be described with reference to the timing chart of FIG. 21.

Figure 21:
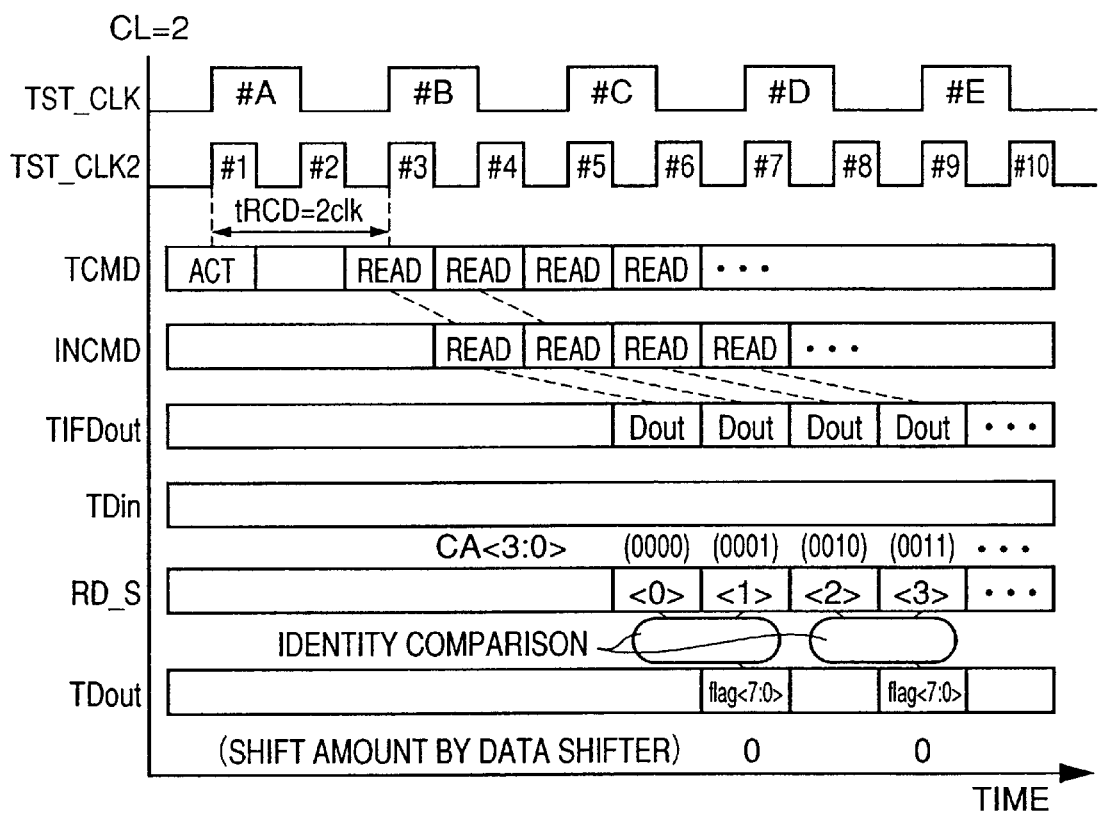
FIG. 21 is a timing chart illustrating an operation of a test interface circuit according to the fourth embodiment.

FIG. 21 illustrates a case where successive read data are obtained by sequentially incrementing column address CA<3:0> to obtain data on the necessity of repairing for each replacement unit. Here, FIG. 21 illustrates the case of CL=2.

Test interface circuit TICb carries out successive read commands in the case of CL=2 for DRAM core MCR. Since the timing at which a test control signal TCMD, an internal control signal INCMD and output data TIFDout from DRAM core MCR are generated in this case is as described with reference to FIG. 13, description thereof will not be repeated.

Read data Dout transmitted from DRAM core MCR to the test interface circuit is selected based on a read data selection signal RD_S by read data selection circuit 4.

Read data selection circuit 4 sequentially outputs, starting from clock cycle #6, test output data D00, D01, D02, D03, . . . , D15 corresponding to incremented 4-bit column address CA<3:0>. Therefore, if column address CA<3:0> is expressed by CA=(CA<3>, CA<2>, CA<1>, CA<0>), test output data D00, D01, D02, D03, . . . , D15 correspond to column addresses CA=(0000), (0001), (0010), (0011), . . . , (1111), respectively.

Since flip-flop 18 shown in FIG. 20 operates for each two clock cycles of internal test clock signal TST_CLK2, it does not operate in clock cycle #6. In clock cycle #7 in which test output data D00 and D01 are transmitted, flip-flop 18 outputs judgement flag <7:0> based on an identity comparison result between the two data. Thereafter, for each two clock cycles of internal test clock signal TST_CLK2, flip-flop 18 carries out identity comparison between test output data transmitted in the cycles and outputs judgement flag <7:0>.

Since judgement flag <7:0> is generated at a rising edge of the internal test clock signal which corresponds to a rising edge of the external test clock signal, data shifter 120 does not have to perform data shifting, and judgement flag <7:0> output from data determination circuit 16 is output as it is to test pin terminals TPG. Thus, at timing synchronous to external clock signal TST_CLK, the external memory tester can obtain from DRAM core MCR to be tested a judgement result concerning redundancy repair judgement.

As described above, data judgement circuit 16 can compress data of a plurality of test output data read out from the DRAM core according to internal test clock signal TST_CLK2, in one clock cycle of external clock signal TST_CLK.

Selector 14 selects whether the read data from read data selection circuit 4 is transmitted directly to data shifter 20 or transmitted to data shifter 20 by way of data judgement circuit 16. It is therefore possible to specify for test pin terminals TPG as to whether the test output data is output as it is or is output after compression.

In a semiconductor integrated circuit device according to the fourth embodiment, a redundancy repair judgement test for DRAM core MCR can be performed efficiently using a low speed memory tester by outputting a judgement flag output from such data determination circuit 16 from test terminals TPG in synchronization with external clock signal TST_CLK.

In FIGS. 18 and 19, the configuration of the DRAM core having an I/O line replacement type spare column is illustrated. However, the fourth embodiment can be applied to methods other than the spare column arrangement method, and it can also be applied to a DRAM core having a column selection line replacement type spare column, for example.

Fifth Embodiment

In a fifth embodiment, another configuration example of the frequency multiplication circuit included in the test interface circuit will be described.

Figure 22:
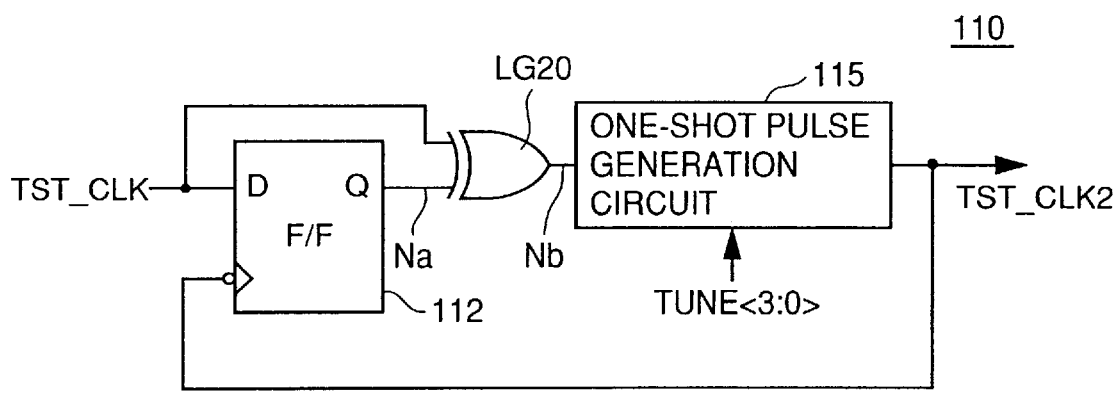
FIG. 22 is a circuit diagram showing a configuration of a frequency multiplication circuit 110 according to a fifth embodiment.

Referring to FIG. 22, a frequency multiplication circuit 110 according to the fifth embodiment includes a flip-flop 112 operating in response to a falling edge of an internal test clock signal TST_CLK2 and transferring an external clock signal TST_CLK to an internal node Na, a logic gate LG20 outputting to an internal node Nb the result of an exclusive OR operation between the signal levels of internal test clock signal TST_CLK and internal node Na, and a one-shot pulse generation circuit 115 generating a one-shot pulse corresponding to a prescribed change in the signal level of internal node Nb.

The pulse width of an output signal generated by one-shot pulse generation circuit 115 can be adjusted by a 4-bit control signal TUNE<3:0>, for example. One-shot pulse generation circuit 115 generates an internal test clock signal TST_CLK2.

In the following, an operation of frequency multiplication circuit 110 will be described with reference to the timing chart of FIG. 23.

Figure 23:
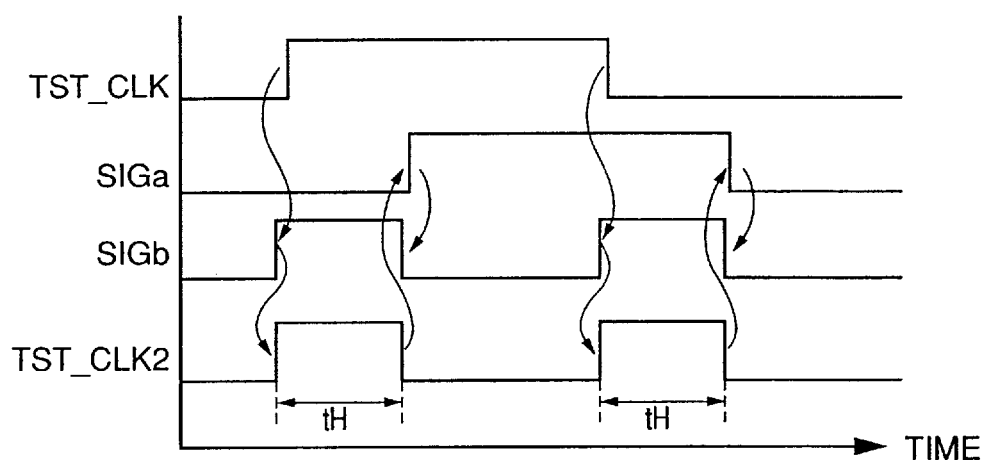
FIG. 23 is a timing chart illustrating an operation of frequency multiplication circuit 110.

Referring to FIG. 23, SIGa and SIGb denote the signal level of internal nodes Na and Nb, respectively.

In an initial state, external clock signal TST_CLK, internal test clock signal TST_CLK2, SIGa and SIGb are all logic low.

In response to a rising edge of external clock signal TST_CLK, the output of logic gate LG20 changes and signal SIGb changes from logic low to logic high. In response to the rise of SIGb from logic low to logic high, one-shot pulse generation circuit 115 activates (to logic high) internal test clock signal TST_CLK2 which is an output signal for the period of a pulse width tH determined by control signal TUNE<3:0>.

Since pulse width tH is set to be shorter than ½ cycle of external clock signal TST_CLK, any change in internal test clock signal TST CLK2 from logic high to logic low at timing after tH causes the output of flip-flop 112 to be changed and signal level SIGa of node Na to be changed from logic low to logic high. The inputs of logic gate LG20 both assume the signal level of external clock signal TST_CLK and therefore correspond to each other, and signal level SIGb of internal node Nb changes to logic low.

Thereafter, even at timing at which external test clock signal TST_CLK falls from logic high to logic low, the inputs of logic gate LG20 do not correspond to each other.

Therefore, signal level SIGb of internal node Nb changes once again from logic low to logic high. Thus, one-shot pulse generation circuit 115 is activated (to logic high) for the period of tH of internal test clock signal TST_CLK2. When the output of one-shot pulse generation circuit 115 changes to logic low after tH, flip-flop 112 transmits once again the signal level of external clock signal TST_CLK to internal node Na, and therefore the output of logic gate LG20 returns to logic low again.

As described above, in response to both rising and falling edges of the external test clock signal, a one-shot pulse having a prescribed pulse width tH can be output as internal test clock signal TST_CLK2.

Since activation period tH of internal test clock signal TST_CLK2 can be adjusted by control signal TUNE<3:0>, the high level width of the internal test clock signal, which is sufficient to operate a test interface circuit and a DRAM core at a multiplied frequency of the external clock signal, can be adjusted. In other words, that also results in improvement of the phase accuracy of a delay circuit 12 for delaying the phase by 90° (¼ cycle) shown in FIG. 2.

Figure 24:
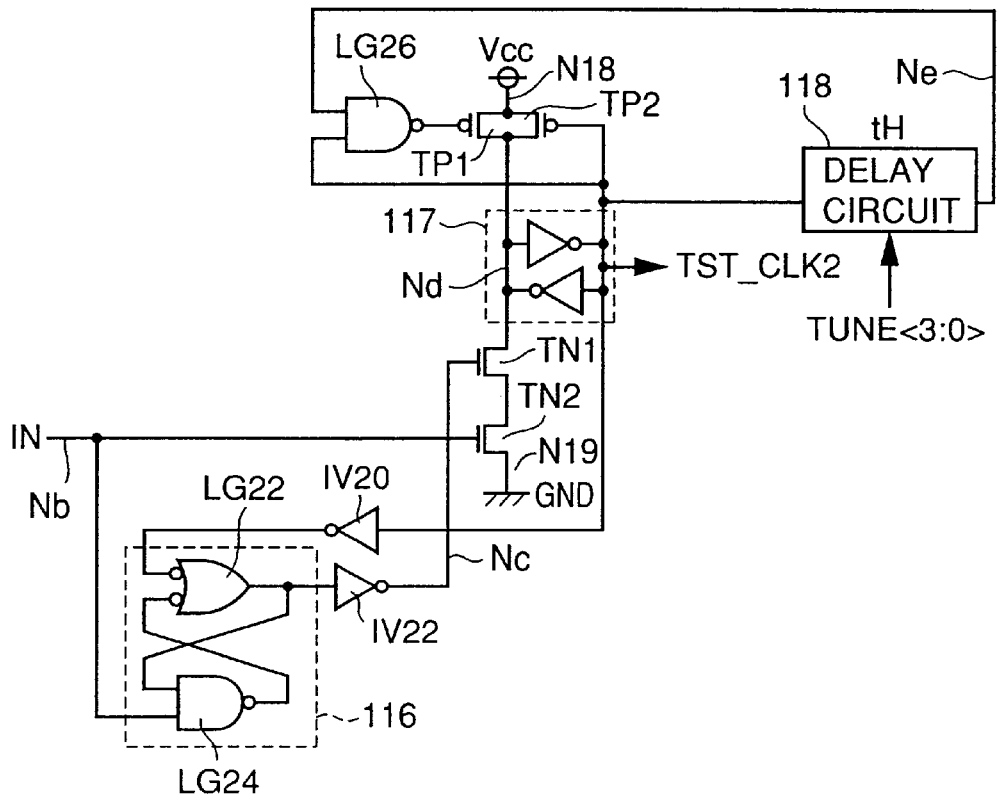
FIG. 24 is a circuit diagram showing a configuration example of a one-shot pulse circuit 115.

Referring to FIG. 24, one-shot pulse generation circuit 115 has logic gates LG22 and LG24 forming a flip-flop 116, an inverter IV22 inverting an output of flip-flop 116 and transmitting it to an internal node Nc, and an inverter IV20 inverting the signal level of internal test clock signal TST_CLK2, which is an output signal of one-shot pulse generation circuit 115, and transmitting it to flip-flop 116.

One-shot pulse generation circuit 115 further has a latch circuit 117 maintaining the signal levels of internal test clock signal TST_CLK2 and an internal node Nd, a delay circuit 118 delaying internal test clock signal TST_CLK2 by tH and transmitting the signal to an internal node Ne, and a logic gate LG26 outputting the result of an NAND logic operation between the signal levels of internal node Ne and internal test clock signal TST_CLK2.

One-shot pulse generation circuit 115 further has P type MOS transistors TP1 and TP2 connected in parallel between a power supply node N18 supplying a power supply voltage Vcc which corresponds to the logic high level of internal test clock signal TST_CLK2 and internal node Nd, and N type MOS transistors TN1 and TN2 connected in series between a ground node N19 supplying a ground voltage GND which corresponds to the logic low level of internal test clock signal TST_CLK2 and internal node Nd.

The gate of P type MOS transistor TP1 is supplied with an output signal of logic gate LG26, and the gate of P type MOS transistor TP2 is supplied with internal test clock signal TST_CLK2. The gates of N type MOS transistors TN1 and TN2 are coupled to internal nodes Nc and Nb, respectively. Delay time tH provided by delay circuit 118 is adjusted by control signal TUNE<3:0> shown in FIG. 22.

Figure 25:
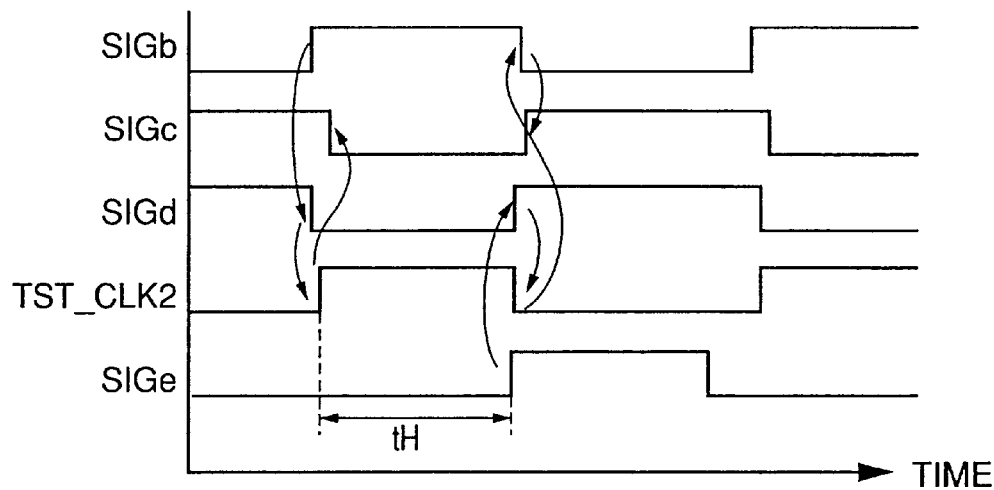
FIG. 25 is a timing chart illustrating an operation of one-shot pulse generation circuit 115.
Figure 26:
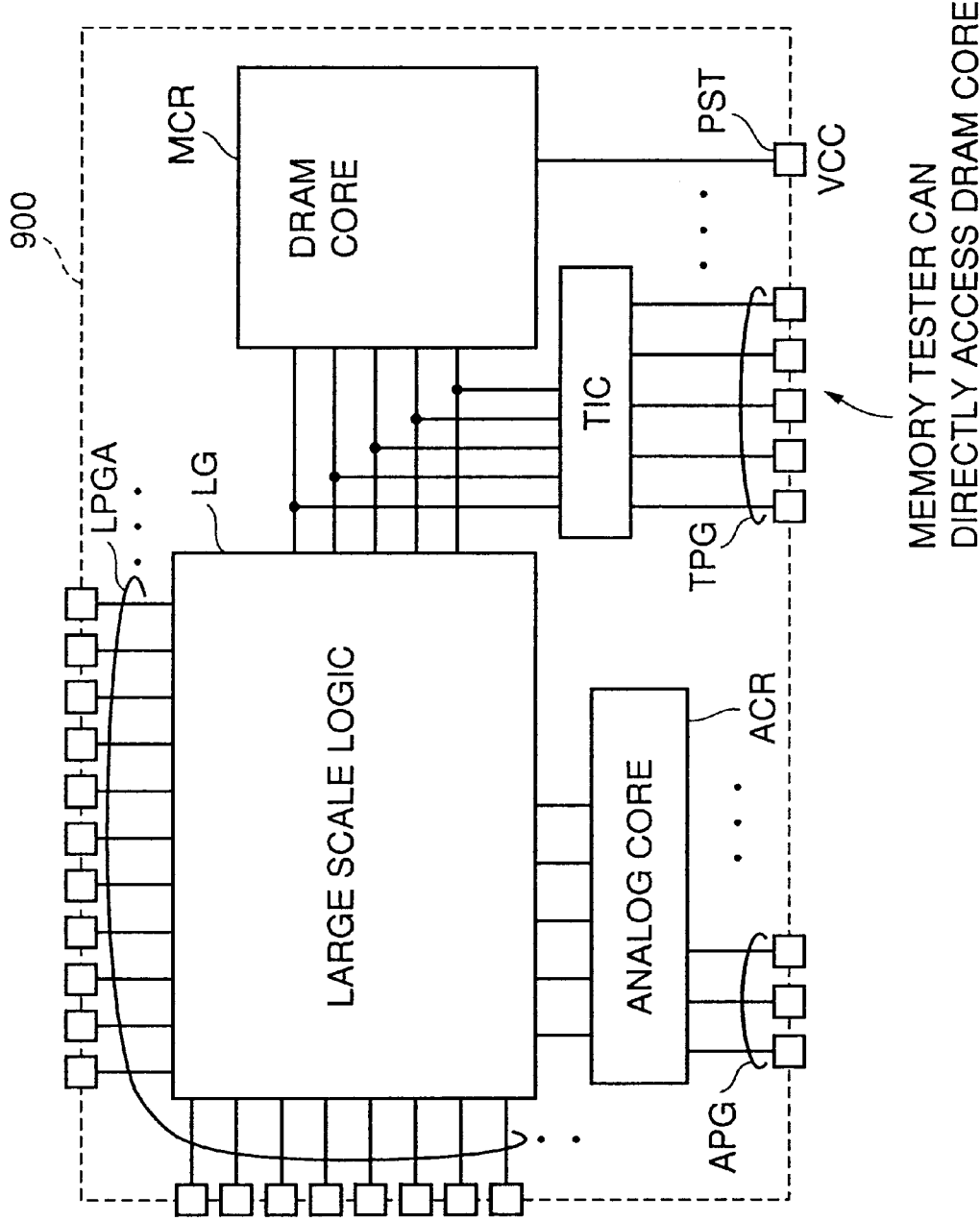
FIG. 26 schematically shows a configuration of a conventional DRAM contained system LSI 900.

An operation of one-shot pulse generation circuit 115 will be described with reference to the timing chart of FIG. 25. In FIG. 25, the signal levels of internal nodes Nb, Nc, Nd and Ne are denoted by SIGb, SIGc, SIGd and SIGe, respectively.

Referring to FIG. 25, in an initial state, signal level SIGb of internal node Nb, which is an input node of one-shot pulse generation circuit 115, is logic low, and therefore signal level SIGc of internal node Nc corresponding to the output of flip-flop 116 is logic high. Furthermore, internal test clock signal TST_CLK2 and signal level SIGe of internal node Ne are logic low. Therefore, P type MOS transistors TP1 and TP2 are off and on, respectively, and N type MOS transistors TN1 and TN2 are on and off, respectively. Thus, internal node Nd is connected to power supply node N18 and signal level SIGd is logic high.

When signal level SIGb of internal node Nb changes from logic low to high, transistor TN2 is also turn on in response. Thus, signal level SIGd of internal node Nd changes from logic high to low, and the signal level of internal test clock signal TST_CLK2 also changes from logic low to high in response. In response, P type MOS transistor TP2 turns off and the signal level of internal test clock signal TST_CLK2 is maintained by a latch circuit 117. In response to the signal level of internal test clock signal TST_CLK2 changing to logic high, the output of inverter IV20 changes to logic low, and signal level SIGc of internal node Nc corresponding to the output of flip-flop 116 changes from logic high to low. Thus, N type MOS transistor TN1 turns off.

Thereafter, at timing in which delay time tH of delay circuit 118 set by control signal TUNE<3:0> has elapsed, the signal level of internal node Ne changes from logic low to high. In response, the output signal of logic gate LG26 changes to logic low and thus P type MOS transistor TP1 turns on. In response to P type MOS transistor TP1 turning on, signal level SIGd of internal node Nd changes from logic low to high and thus internal test clock signal TST_CLK2 also changes from logic high to low in response. In short, internal test clock signal TST_CLK2 comes to be a signal having an activation period (high level) for a period corresponding to delay time tH of delay circuit 118.

As described with reference to FIG. 23, any change in internal test clock signal TST_CLK2 from logic high to low causes signal level SIGb of internal node Nb to change to logic low because of the function of logic gate LG20 shown in FIG. 22. In response, the outputs of flip-flop 116 changes, the signal level of internal node Nc returns from logic low to high, and therefore a state similar to the initial state is reproduced.

If signal level SIGb of internal node Nb changes once again from logic low to high in this state, internal test clock signal TST_CLK2 is activated (to high level) for a period corresponding to delay time tH.

By generating internal test clock signal TST_CLK2 by frequency multiplication circuit 110 using one-shot pulse generation circuit 115 having such a configuration, and performing an internal test operation for DRAM core MCR, the test operation for DRAM core MCR described from the first to fourth embodiments can be carried out based on an internal test clock signal having a sufficient adjustable high level width.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device, comprising:
   a memory circuit operating in synchronization with an operational clock signal and performing given operational directions; and
   a test interface circuit supplying said operational clock signal and said operational directions to said memory circuit and communicating data with said memory circuit according to test directions input in synchronization with a test clock signal during testing,
   said test interface circuit including a frequency multiplication circuit multiplying a frequency of said test clock signal to generate an internal test clock signal to be supplied as said operational clock signal to said memory circuit.

2. The semiconductor integrated circuit device according to claim 1, wherein said test interface circuit further includes a test command generation circuit generating said operational directions for said memory circuit in synchronization with said internal test clock signal.

3. The semiconductor integrated circuit device according to claim 2, wherein said internal test clock signal cyclically repeats a first transition in which it makes a transition from a first signal level to a second signal level and a second transition in which it makes a transition from said second signal level to said first signal level, and
   said test command generation circuit has
      a first latch circuit responsive to said first transition of said internal test clock signal for capturing said test directions input to said test interface circuit,
      a command decoder generating said operational directions according to said test directions latched by said first latch circuit, and
      a second latch circuit responsive to said second transition of said internal test clock signal for outputting said operational directions generated by said command decoder to said memory circuit.

4. The semiconductor integrated circuit device according to claim 3, wherein setup time and hold time of a signal indicating said test directions input to said test interface are set to be at most ¼ times as long as a cycle of said test clock signal.

5. The semiconductor integrated circuit device according to claim 2, wherein said test command generation circuit has
   a first latch circuit capturing said test directions input to said test interface circuit in synchronization with said test clock signal,
   a command decoder generating said operational directions according to said test directions latched by said first latch circuit, and
   a second latch circuit outputting said operational direction generated by said command decoder to said memory circuit in synchronization with said internal test clock signal.

6. The semiconductor integrated circuit device according to claim 5, wherein setup time and hold time of a signal indicating said test directions input to said test interface are set to be at most ½ times as long as a cycle of said test clock signal.

7. The semiconductor integrated circuit device according to claim 1, wherein said test clock signal cyclically repeats a first transition in which it makes a transition from a first signal level to a second signal level and a second transition in which it makes a transition from said second signal level to said first signal level, and
   said test interface circuit further includes an output timing adjustment circuit holding data read out from said memory circuit for a data shift period and then outputting the data to be synchronized with said test clock signal.

8. The semiconductor integrated circuit device according to claim 7, wherein said test interface circuit further includes a mode register holding column latency set for said memory circuit,
   said data shift period is N (N: an integer of at least 0) times as large as a cycle of said internal test clock signal, and
   said output timing adjustment circuit sets N according to said column latency.

9. The semiconductor integrated circuit device according to claim 7, wherein said test interface circuit further includes a mode register holding column latency set for said memory circuit, said data shift period is N (N: an integer of at least 0) times as large as a cycle of said internal test clock signal, and said output timing adjustment circuit sets N according to a cycle in which a reading operation is specified for said memory circuit and said column latency.

10. The semiconductor integrated circuit device according to claim 7, wherein said test interface circuit further includes a determination circuit receiving read data output from said memory circuit in synchronization with said internal test clock signal, and compressing a plurality of pieces of said read data read out from said memory circuit in one cycle of said test clock signal to generate determination data, and said output timing adjustment circuit receives said determination data from said determination circuit, and outputs said determination data in synchronization with said test clock signal.

11. The semiconductor integrated circuit device according to claim 10, wherein said plurality of pieces of read data each have a plurality of bits, and said determination circuit has
a data hold circuit holding at least one of said plurality of pieces of read data,
a gate circuit receiving said plurality of pieces of read data from said data hold circuit and said memory circuit and outputting as said determination data a result of identity comparison of data levels between said plurality of pieces of read data in each of said plurality of bits, and
a counter circuit activating said gate circuit whenever a prescribed clock cycle of said internal test clock signal has elapsed to output said determination data at timing synchronous to said test clock signal.

12. The semiconductor integrated circuit device according to claim 1, wherein said test clock signal cyclically repeats a first transition in which it make a transition from a first signal level to a second signal level and a second transition in which it makes a transition from said second signal level to said first signal level, said frequency multiplication circuit has a pulse generation circuit setting a signal level of said internal test clock signal at said second signal level in response to said first transition of said test clock signal, and setting the signal level of said internal test clock signal again at said first signal level after a prescribed time period, and said pulse generation circuit adjusts said prescribed time period according to a control signal input to said test interface circuit.

13. A semiconductor integrated circuit device, comprising:

a memory circuit operating in synchronization with an operational clock signal and performing given operational directions; and a test interface circuit supplying said operational clock signal and said operational directions to said memory circuit and communicating data with said memory circuit according to test directions input in synchronization with a test clock signal during testing, said test interface circuit including
a test clock control terminal receiving a selection signal for selecting a frequency of said operational clock signal in said testing, and
a frequency multiplication circuit generating, according to said test clock signal, an internal test clock signal to be supplied as said operational clock signal to said memory circuit, and
said frequency multiplication circuit outputting, according to said selection signal, one of said test clock signal and a clock signal generated by multiplying a frequency of said test clock signal as said internal test clock signal.

* * * * *